United States Patent
Ragot et al.

(10) Patent No.: US 7,994,944 B2
(45) Date of Patent: Aug. 9, 2011

(54) ENCODING/DECODING OF DIGITAL SIGNALS, ESPECIALLY IN VECTOR QUANTIZATION WITH PERMUTATION CODES

(75) Inventors: Stéphane Ragot, Lannion (FR); Claude Lamblin, Perros-Guirec (FR)

(73) Assignee: France Telecom, Paris (FR)

( * ) Notice: Subject to any disclaimer, the term of this patent is extended or adjusted under 35 U.S.C. 154(b) by 530 days.

(21) Appl. No.: 12/224,038

(22) PCT Filed: Feb. 13, 2007

(86) PCT No.: PCT/FR2007/050778
§ 371 (c)(1),
(2), (4) Date: Aug. 15, 2008

(87) PCT Pub. No.: WO2007/093730
PCT Pub. Date: Aug. 23, 2007

(65) Prior Publication Data
US 2010/0228551 A1    Sep. 9, 2010

(30) Foreign Application Priority Data
Feb. 17, 2006    (FR) .................................... 06 01435

(51) Int. Cl.
*H03M 7/00*    (2006.01)
(52) U.S. Cl. ........................................ 341/50; 704/500
(58) Field of Classification Search ................. 341/50, 341/87; 704/500; 375/295; 714/701
See application file for complete search history.

(56) References Cited

U.S. PATENT DOCUMENTS
3,990,071 A * 11/1976 Ito et al. ........................ 341/54

OTHER PUBLICATIONS

Schalkwijk, "An Algorithm for Source Coding", IEEE Transactions on Information Theory, vol. 18, No. 3, May 1972, XP002416891.
Varshney et al., "Ordered and Disordered Source Coding", Research Laboratory of Electronics, Massachusetts Institute of Technology, Feb. 2006, XP002416890.
Varshey, "Permutations and Combinations", Dec. 2004, XP002416898.
3GPP TS 26.273 V6.1.0 (Jun. 2005).
3GPP TS 26.304 V6.3.0 (Jun. 2005).

* cited by examiner

*Primary Examiner* — Joseph Lauture
(74) *Attorney, Agent, or Firm* — McKenna Long & Aldridge LLP

(57) ABSTRACT

The invention relates to the encoding/decoding of digital signals, especially using transposition codes involving a calculation of combinatorial expressions. According to the invention, the combinatorial expressions are represented by prime factor power decompositions, and determined by a preliminary reading of pre-recorded representations of decompositions of selected whole numbers.

13 Claims, 9 Drawing Sheets

ENCODING/DECODING OF DIGITAL SIGNALS, ESPECIALLY IN VECTOR QUANTIZATION WITH PERMUTATION CODES

This application is a national stage entry under 35 U.S.C. §371 of International Application Number PCT/FR2007/00050778, filed on Feb 13, 2007, and claims priority to French Application Number 06 01435, filed on Feb 17, 2006, both of which are hereby incorporated by reference in their entireties.

The present invention relates to the encoding/decoding of digital signals such as audio, video, and more generally multimedia signals, for their storage or transmission. It proposes in particulars solution to the problems raised by the encoding and decoding of permutation codes.

Typically, the present invention also applies to the counterpart of the source encoding: the channel encoding or "modulation".

Compression encoding/decoding of digital signals in the sense of the invention can be very useful for the quantization of the transform coefficients of speech and/or audio signal frequency encoders.

Vector Quantization

One very widely-used digital signal compression solution is vector quantization. Vector quantization represents an input vector by a vector of the same dimension selected from a finite set. A quantizer with M levels (or "code vectors") is a non-bijective application of the set of input vectors, generally the n-dimensional real euclidian space $R^n$ or a subset of $R^n$ in a finite subset Y of $^n$ with M separate elements: $Y=\{y_0, y_1, \ldots y_{M-1}\}$.

Y is called reproduction alphabet or "dictionary" or even "directory", and its code vector elements are called "code words" (or "output points" or even "representatives").

The bit rate for each dimension r of the quantizer (or its "resolution") is defined by the relation:

$$r = \frac{1}{n}\log_2 M$$

In vector quantization, a block of n samples is treated as an n-dimensional vector. According to the theory of source encoding when the dimension becomes very large, the performance of the vector quantization approaches the source distortion bit rate limit. The vector quantizer dictionaries can be designed using statistical methods such as the Generalized Lloyd Algorithm (GLA), based on the necessary conditions of optimality of a vector quantizer. The duly obtained statistical vector quantizers have no structure, which makes their exploration costly in terms of calculation and storage resources, because the complexity of both encoding and storage is proportional to $n2^{nr}$.

Figure 1A:
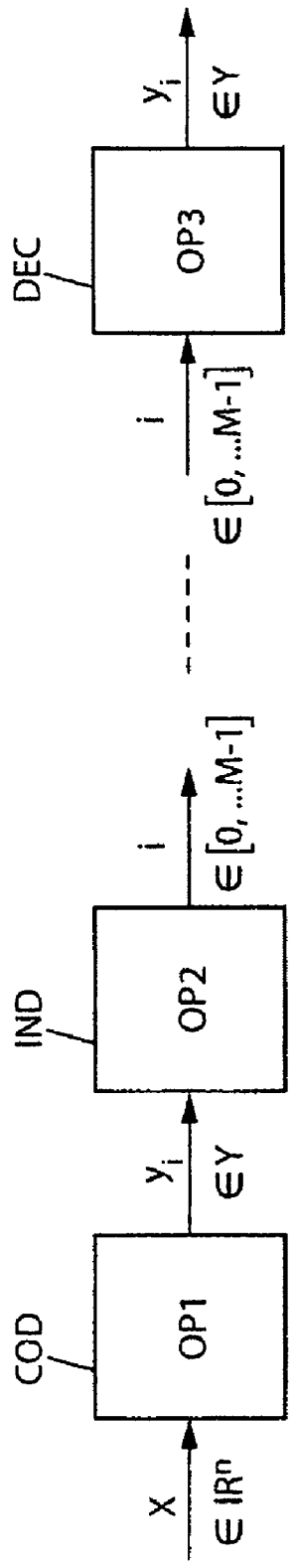

Referring to FIG. 1A, three major operations use a vector quantizer: two in the encoding and one in the decoding. An input vector is encoded (step COD) by first selecting a code vector from a dictionary. This is the code vector that most resembles it (operation OP1 in FIG. 1A). Then, the index of this code vector is determined (step IND) to be transmitted or stored (operation OP2 in FIG. 1A). On the decoder (step DEC), the code vector is determined from its index (operation OP3 in FIG. 1A).

Figure 1B:
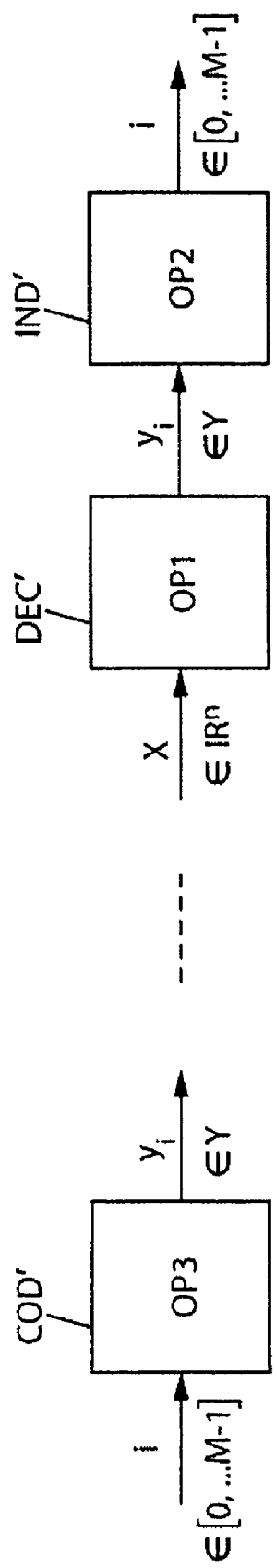

In modulation, the three operations OP1, OP2 and OP3 of FIG. 1A are applied, but in a different order. Referring to FIG. 1B which illustrates this modulation/quantization duality, provision is made for the transition from an index to a code vector (COD' step in FIG. 1B corresponding to operation OP3 in FIG. 1A). Then, after transmission over a noise-affected channel, a search is made for the code vector that is closest to the received vector (step DEC' in FIG. 1B corresponding to the operation OP1 in FIG. 1A). Finally, the decoding of the index of the code vector is the third step (step IND' in FIG. 1B corresponding to operation OP2 in FIG. 1A).

The exponential increase in the complexity, according to the dimension, the vectors and the bit rate, limits the use of non-structural vector quantizers with small dimensions and/or low bit rates to be able to use them in real time. For a non-structured vector quantizer, the search for the closest neighbor (operation OP1) requires an exhaustive search among all the elements of the dictionary to select the dictionary element that minimizes a distance measurement between itself and the input vector. The latter two operations (indexing OP2 and reverse operation OP3) are generally performed by simple readings of tables, that are nevertheless costly in memory space. To overcome the size and dimension constraints, several variants of the basic vector quantization have been studied. They attempt to remedy the absence of dictionary structure and so reduce the complexity, but at the cost of quality. However, the performance/complexity trade-off is enhanced, which makes it possible to increase the range of the resolutions and/or dimensions to which the vector quantization can be applied cost-effectively. Many structured vector quantizer schemes have been proposed, and, in particular, the vector quantizer that implements a "permutation code" described below.

Permutation Codes

In the "permutation code" vector quantizer, the code vectors are obtained by permutations of the components of the first code vector (in lexicographic order) called "leader" (or even "leader vector"). These components take their values from an alphabet $A=\{a_0, a_1, \ldots, a_{q-1}\}$ of size q (q-ary alphabet A such that $a_i \neq a_j$ for $i \neq j$). The components $a_i$ are real (or whole) numbers. The weight $w^i$ (where i is an index ranging from 0 to q−1) is the number of repetitions of the letter $a_i$ of the alphabet. The weights $w^i$ are positive integer numbers such that $$\sum_{i=0}^{q-1} w^i = n.$$

By convention, the values of the alphabet satisfy $a_0 > a_1 > \ldots > a_{q-1}$. The n components of the leader go in descending order from the position 0 to the position (n−1). The leader vector $y_0$ is therefore a vector of dimension n of the form:

$$y_0 = (\underbrace{a_0, \ldots, a_0}_{w^0}, \underbrace{a_1, \ldots, a_1}_{w^1}, \ldots, \underbrace{a_{q-1}, \ldots, a_{q-1}}_{w^{q-1}}) \quad (1)$$

It will be understood that a different order of the components could be chosen, for example $a_0 < a_1 < \ldots < a_{q-1}$.

The leader vector is called "signed leader" and the permutation code is said to be "of type I". The other code vectors are obtained by permutations of the components of $y_0$. The total number M of permutations is:

$$M = \frac{n!}{\prod_{i=0}^{q-1} w^i !} \quad (2)$$

There is another type of permutation code (type II). The leader vector again has the same form as previously, but its components must be positive ($a_0 > a_1 > \ldots > a_{q-1} \geq 0$). The other code vectors are also obtained by to permutations of the components of $y_0$ by assigning them all the possible sign combinations. The total number M of permutations is:

$$M = 2^h \frac{n!}{\prod_{i=0}^{q-1} w^i !} \quad (3)$$

with $h = n$ if $a_{q-1} > 0$ and $h = n - w^{q-1}$ otherwise.

In this case, the leader vector is also called absolute leader.

The "permutation code" vector quantizer has been extended to the compounding (or union) of permutation codes and recently, this permutation code union structure has been generalized to variable dimension and resolution vector quantization (in document WO-04/00219 in the name of the Applicant). The permutation codes are not only used in statistical vector quantization. They are also found in algebraic vector quantization, which uses highly structured dictionaries, deriving from regular arrays of dots or error correcting codes. The permutation codes are also employed in modulation.

The use of the permutation code structure allows for the development of optimal and rapid nearest neighbor, search algorithms (operation OP1 in FIG. 1A). However, the indexing (or numbering) of the code vectors (operation OP2 in FIG. 1A) and the reverse decoding operation (operation OP3 in FIG. 1A) require more calculations than in the case of non-structured vector quantizers.

There are several ways of enumerating the permutations. The Schalkwijk algorithm is one of these ways:

"*An algorithm for source coding*", by Schalkwijk J. P. M, in IEEE Trans. on Information Theory, vol. IT-18, No 3, pp 395-399, May 1972.

Using combinatorial analysis, these techniques make it possible to index a code vector of a permutation code (operation OP2) and also perform the reverse index decoding operation (operation OP3). Among the permutation indexing algorithms, the commonly-used Schalkwijk algorithm is reviewed below, for example in the standards:

[3GPP TS 26.273] (ANSI-C code for the Fixed-point Extended AMR-Wideband (AMR-WB+) codec; V6.1.0 (2005-06) (Release 6)), and [3GPP TS 26.304] (Extended Adaptive Multi-Rate-Wideband (AMR-WB+) codec; Floating-point ANSI-C code; V6.3.0 (2005-06) (Release 6), June 2005).

Calculating the Rank of a Permutation in the Encoding (Operation OP2 in FIG. 1A)

This involves ordering and indexing all the possible permutations of the components of the vector $y = (y_0, y_1 \ldots, y_{n-1})$. The order is lexicographic and the index is here called "rank". Calculating the rank of the vector y involves calculating the rank of the vector $D = (d_0, d_1 \ldots, d_{n-1})$ associated with y, and such that $d_k$ has an index value d if, and only if, $y_k = a_d$.

For example, a vector y, of dimension n=8, has the following components:

$y = (4, 2, 4, 0, 0, 4, 4, 2)$

The alphabet with q=3 letters (components of different values) is given by $A = \{4, 2, 0\}$ with $a_0 = 4$, $a_1 = 2$ and $a_2 = 0$.

The vector y then has associated with it the vector $D = (0, 1, 0, 2, 2, 0, 0, 1)$, the components of which are simply the indices of the q letters of the alphabet A.

The ranks of y and D are the same, but the definition of the vector D reduces the operation to the calculation of the rank of a sequence D having its values in a set $\{0, 1, \ldots, q-1\}$ (comprising the same number of elements as the alphabet $\{a_0, a_1, \ldots, a_{q-1}\}$).

The weights of the vectors y and D are the same since the occurrences of their respective components are the same. The intermediate weight $(w_k^0, w_k^1, \ldots, w_k^{q-1})$ is also defined as the weight of the vector of components $(y_k, y_{k+1} \ldots, y_{n-1})$ and which therefore corresponds to vector y truncated to leave the positions k to n−1. Thus:

$$w_k^d = \sum_{i=k}^{n-1} \delta(y_i, a_d) = \sum_{i=k}^{n-1} \delta(d_i, d) \quad (4)$$

where $\delta(x, y)$ is the Kronecker operator ($\delta(x, y) = 1$ if $x = y$ and 0 otherwise).

The following applies: $(w_0^0, w_0^1, \ldots, w_0^{q-1}) = (w^0, w^1, \ldots, w^{q-1})$.

The rank t of the vector y can be calculated, by combinatorial analysis, by the formula:

$$t = \sum_{k=0}^{n-1} \sum_{d=0}^{d_k-1} \frac{(n-1-k)!}{(w_k^d - 1)! \prod_{\substack{i=0 \\ i \neq d}}^{q-1} (w_k^i !)}, \quad (5)$$

with $\sum_{d=0}^{-1} = 0$ and $(-1)! = \infty$

This formula can be simplified as follows:

$$t = \sum_{k=0}^{n-1} \frac{(n-1-k)!}{\prod_{i=0}^{q-1} (w_k^i !)} \left( \sum_{d=0}^{d_k-1} w_k^d \right) = \sum_{k=0}^{n-1} I_k^{d_k} \quad (6)$$

It is this latter formulation that is often used and that will therefore be adopted here. Hereinafter, $I_k^{d_k}$ will be called "partial rank of order k", with:

$$I_k^{d_k} = \frac{(n-1-k)!}{\prod_{i=0}^{q-1} (w_k^i !)} \left( \sum_{d=0}^{d_k-1} w_k^d \right) \quad (7)$$

Decoding the Rank (Operation OP3): Determining the Permutation from its Index

Decoding the rank t entails retrieving the vector $D = (d_0, d_1, \ldots, d_{n-1})$ associated with y. One method of sequentially searching for the $d_k$ is described below. The component $d_0$ is determined first, followed by the component $d_1, \ldots$ to the component $d_{n-1}$.

Determination of $d_0$:

$d_0$ is found by using the formula comprising the inequalities:

$$\frac{(n-1)!}{\prod_{i=0}^{q-1}(w_0^i!)}\left(\sum_{d=0}^{d_0-1}w_0^d\right) \leq t < \frac{(n-1)!}{\prod_{i=0}^{q-1}(w_0^i!)}\left(\sum_{d=0}^{d_0}w_0^d\right) \quad (8)$$

The terms $(n-1)!$, $t$, $$\prod_{i=0}^{q-1}(w_0^i!)$$

and the values $w_0^d$ for $d=0, \ldots, q-1$ are known. To find the value of $d_0$, $d_0=0$ is used as the starting point, and $d_0$ is successively incremented by 1 until the formula (8) is satisfied. By writing the formula (8) with the partial ranks, the value $d_0$ is such that:

$$I_0^{d_0} \leq t < I_0^{d_0+1} \text{ with } I_0^{d_0} = \frac{(n-1)!}{\prod_{i=0}^{q-1}(w_0^i!)}\left(\sum_{d=0}^{d_0-1}w_0^d\right)$$

Determination of $d_1$:

To find $d_1$, the following relation is used:

$$\frac{(n-2)!}{\prod_{i=0}^{q-1}(w_1^i!)}\left(\sum_{d=0}^{d_1-1}w_1^d\right) \leq t - I_0^{d_0} < \frac{(n-2)!}{\prod_{i=0}^{q-1}(w_1^i!)}\left(\sum_{d=0}^{d_1}w_1^d\right) \quad (9)$$

The values of $w_1^d$ for $d=0, \ldots, q-1$ are deduced from those of $w_0^d$ as follows:

$w_1^d = w_0^d - 1$ if $d=d_0$ and $w_1^d = w_0^d$ if $d \neq d_0$ ($w_0^d$ is then repeated as long as d is different from $d_0$).

We come back to the same problem as the determination of the component $d_0$.

To find the value of $d_1$, $d_1=0$ is used as the starting point and $d_1$ is successively incremented by 1 until the inequality (9) is satisfied ($I_1^{d_1} \leq (t-I_0^{d_0}) < I_1^{d_1+1}$).

Determination of the Other $d_k$:

The calculation of the subsequent $d_k$ is deduced from the cases described above. To find the value of $d_k$, $d_k=0$ is used as the starting point and $d_k$ is successively incremented by 1 until the inequality $$I_k^{d_k} \leq \left(t - \sum_{k=0}^{k-1}I_k^{d_k}\right) < I_k^{d_k+1}$$

is satisfied.

Once the vector $D=(d_0, \ldots, d_{n-1})$ is decoded, the vector y is deduced from it by simple alphabet transposition.

STATE OF THE ART AND PROBLEMS POSED

The indexing of a permutation code and the reverse operation are complex operations. The algorithms used apply combinatorial analysis. The indexing of the combinations and the reverse operation require divisions of factorial products.

Complexity of Division

Despite the advances made in integrated circuitry and signal processing processors, division remains a complex operation. Typically, the division of an integer number represented on 16 bits by an integer number represented on 16 bits costs 18 times more than their multiplication. The weight of the division of a 32-bit integer number by a 16-bit integer number is 32 whereas the weight of their multiplication is 5.

Framing of the Variables

The cost of division is not the only problem. The framing of the variables is another, as the table 1 below illustrates.

Only the factorials of the integer numbers less than or equal to 8 can be represented on whole words of 16 bits. For numbers greater than 12, the representation of the factorials on whole words of 32 bits is no longer possible.

Furthermore, the complexity of the operations also increases with the number of bits used to represent the variables. Thus, the division by a 16-bit integer of a 32-bit integer is almost twice as complex (weight 32) as the division of a 16-bit integer (weight 18).

TABLE 1

Factorials of integer numbers

| n | n! | Log$_2$ (n!) |
|---|---|---|
| 0 | 1 | 0 |
| 1 | 1 | 0 |
| 2 | 2 | 1 |
| 3 | 6 | 2.5849625 |
| 4 | 24 | 4.5849625 |
| 5 | 120 | 6.9068906 |
| 6 | 720 | 9.4918531 |
| 7 | 5040 | 12.299208 |
| 8 | 40320 | 15.299208 |
| 9 | 362880 | 18.469133 |
| 10 | 3628800 | 21.7910611 |
| 11 | 39916800 | 25.2504927 |
| 12 | 479001600 | 28.8354552 |
| 13 | 6227020800 | 32.535895 |
| 14 | 87178291200 | 36.3432499 |
| 15 | 1307674368000 | 40.2501405 |
| 16 | 20922789888000 | 44.2501405 |

Solutions for reducing the complexity of the operation OP1 have been proposed. The problem of the complexity of the operations OP2 and OP3 is not very well covered. However, notably in the Applicant's TDAC coder/decoder, or in the 3GPP-AMR-WB+ encoder, simplifications have been made to the encoding and decoding algorithms based on the Schalkwijk formula.

Simplifications of the Enumeration of the Permutations and of the Reverse Operation (Operations OP2 and OP3)

The calculation of the rank t of a permutation and the reverse operation have been accelerated by virtue of simplifications described below made to the calculation of the n terms $I_k^{d_k}$, the definition of which is reviewed below:

$$I_k^{d_k} = \frac{(n-1-k)!}{\prod_{i=0}^{q-1}(w_k^i!)}\left(\sum_{d=0}^{d_k-1}w_k^d\right), (0 \leq k \leq n-1)$$

The first two are used to reduce the complexity in both encoding and decoding. The third is used in the encoding and the last two in the decoding.

Figure 2:
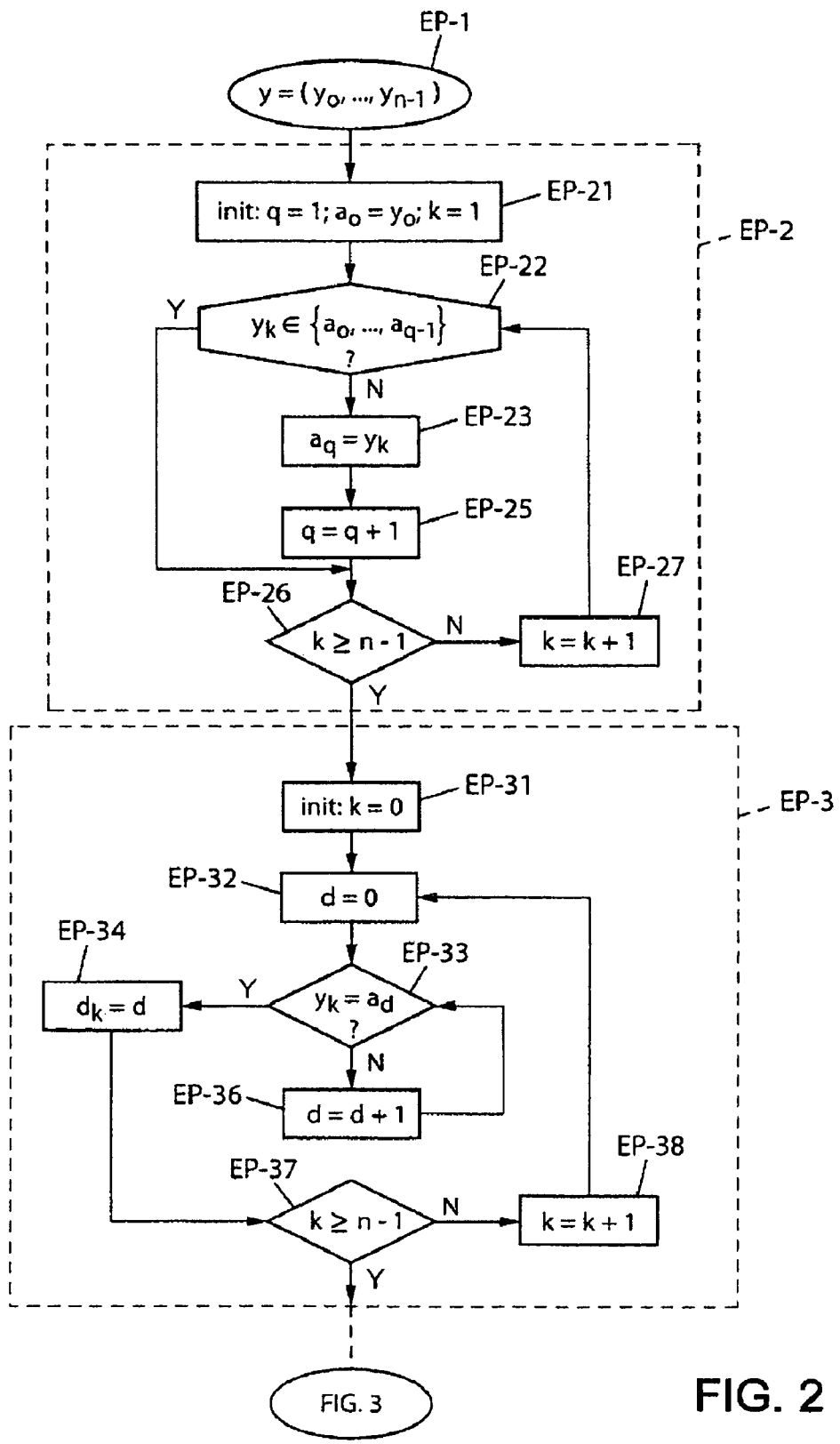
Figure 3:
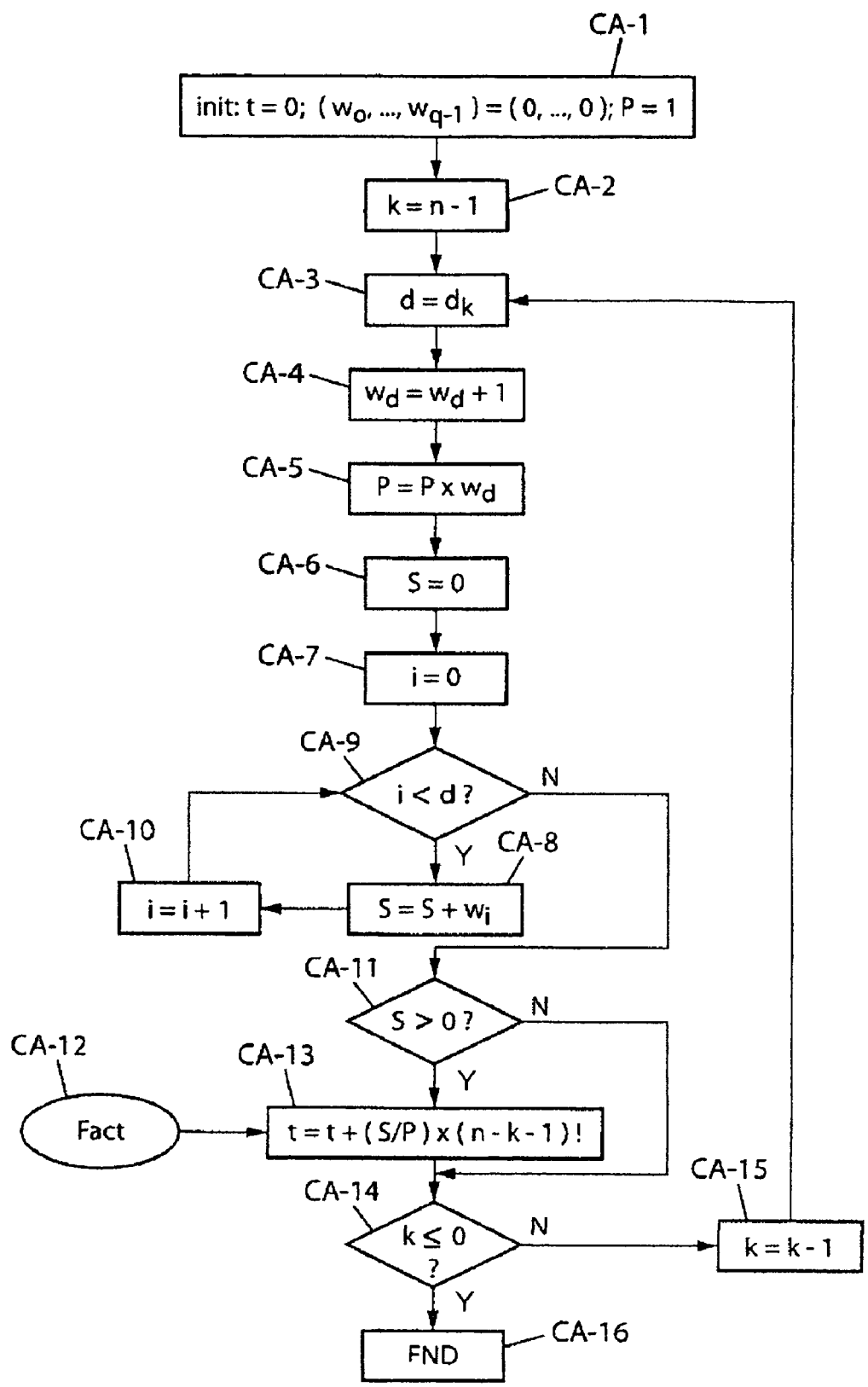

The encoding technique is illustrated by FIGS. 2 and 3. In particular, FIG. 3 covers the calculation of the rank by the Schalkwijk formula in the sense of the prior art whereas FIG. 2 illustrates preliminary steps (referenced "EP-n", designating nth preliminary step, in FIG. 2).

Referring to FIG. 2, the processing begins with the step EP-1, in which the components of the vector $y=(y_0, \ldots, y_{n-1})$ are recovered. The subsequent general step EP-2 covers the calculation of the elements of the alphabet used for this vector $A=(a_0, \ldots, a_{q-1})$, and the determination of the maximum index q. To do this, after an initialization step EP-21 in which $q=1$, $a_0=y_0$ are set, a loop is conducted on the index k between 1 and n−1 (end test EP-26 and incrementation otherwise EP-27) to search for the elements $a_q$ as follows:

if the component $y_k$ of current index k is not already among the elements $\{a_0, \ldots, a_{q-1}\}$ (test EP-22), a new element $a_q$ must be assigned, such that $a_q=y_k$ (step EP-23) to the set $\{a_0, \ldots, a_{q-1}\}$ and q must be incremented by 1 (step EP-25).

The subsequent general preliminary step EP-3 is a calculation of the vector $D=(d_0, \ldots, d_{n-1})$ as follows:

for k ranging from 0 to n−1 (step EP-31 for initializing k at 0, end test EP-37 on k and incrementation EP-38 otherwise), the value d is found in the set of the indices $(0, \ldots, q-1)$ such that $y_k=a_d$ (test EP-33 in the loop on d and incrementation EP-36 with $d=d+1$ otherwise).

Referring to FIG. 3, there now follows a description of the steps for calculation of the rank t that follow the preliminary processing illustrated in FIG. 2. The steps illustrated in FIG. 3 are referenced "CA-n" to design an nth encoding step in the sense of the prior art.

The step CA-1 is an initialization of the rank t at 0, of the variable P at 1 (denominator used in the calculation of the rank in the step CA-13) and of the q weights $w_0, \ldots, w_{q-1}$ at 0.

Here, the value of k is decremented from n−1 to 0 (step CA-2 for initialization of k at n−1, end test CA-14 and decrementation CA-15 otherwise). The benefit of such a selection is described later. The components $d_k$ of the vector D obtained in the preliminary step EP-3 are then used, and, for a current k, $d=d_k$ is set (step CA-3). The associated weight $w_d$ ($w_d=w_d+1$ in the step CA-4) is updated to estimate the term P ($P=P \times w_d$ in the step CA-5). The sum S used on the numerator in the calculation of the rank corresponding to the step CA-13 is initialized at 0 (step CA-6) and a loop is then run on the index i of the weights $w_i$ (end test CA-9 and incrementation CA-10 otherwise, to d−1) to update the sum S ($S=S+w_i$ in the step CA-8). Before calculating the rank t in the step CA-13, a check is made to ensure that the sum S is not zero (test CA-11). The benefit of this implementation is described later.

The calculation of the rank t (step CA-13) involves the factorial term (n−k−1)! as follows:

$$t=t+(S/P)(n-k-1)!$$

Instead of calculating the term (n−k−1)! on each update of the rank t, preference is given to pre-recording these values in memory and using a simple memory access (step CA-12) to obtain the current value of (n−k−1)!.

Thus, some of the advantages of the processing illustrated in FIG. 3 will be taken up again in the implementation of the present invention. These advantages are detailed below.

Storage of the Factorials

To avoid calculating the terms (n−1−k)! and $w_k^i!$ in real time, the values of the n+1 factorials (0!, 1!, ..., n!) are pre-calculated and stored. If the dimension n varies in a limited way ($n \leq n_{max}$), the values 0!, 1!, ..., $n_{max}!$ are precalculated and stored.

Test on the Cumulation of the Intermediate Weight to Avoid Division

There is no point in calculating $$I_k^{d_k} = \frac{(n-1-k)!}{\prod_{i=0}^{q-1}(w_k^i!)} \left(\sum_{d=0}^{d_k-1} w_k^d\right)$$

if the term $$S_k = \sum_{d=0}^{d_k-1} w_k^d$$

is zero. Now, this term is often zero, particularly for the last positions (k close to n−1). By adding a test as to the zero nature of this term (test CA-11 of FIG. 3), a division (and a multiplication) can be avoided. Since the calculation of a division is significantly more complex than a test, the saving in complexity is significant.

Reversal of the Loop on the Positions in Encoding

The weights $w_k^d$ (with $d=0, 1, \ldots, q-1$) are deduced from the weights $w_{k+1}^d$ by incrementing $w_{k+1}^{d_k}$ by 1 and by repeating the other values $w_{k+1}^d$, for $d \neq d_k$. It is then possible to create a loop (steps CA-2, CA-14, CA-15 in FIG. 3) working from the last position (k=n−1) of the vector to the first (k=0). This "reversed" loop makes it possible to calculate, after an initialization at 1, the term $P_k$ such that:

$$P_k = \prod_{i=0}^{q-1}(w_k^i!),$$

with only an incrementation and a multiplication for each iteration, or:

$$w_k^{d_k} = w_{k+1}^{d_k} + 1$$

and $P_k = w_k^{d_k} \times P_{k+1}$   $\left(\prod_{i=0}^{q-1}(w_k^i!) = w_k^{d_k} \times \prod_{i=0}^{q-1}(w_{k+1}^i!)\right)$ It is also possible to process the last two positions separately (k=n−1 and k=n−2). In effect, for the last position (k=n−1), $$\sum_{d=0}^{d_{n-1}-1} w_{n-1}^d = 0$$

therefore $I_{n-1}^{d_{n-1}}=0$ for the penultimate position (k=n−2), if $d_{n-2} > d_{n-1}$, $$\sum_{d=0}^{d_{n-2}-1} w_{n-2}^d = 1 \text{ and } P_{n-2} = \prod_{i=0}^{q-1}(w_{n-1}^i!) = 1! \cdot 1! \cdot \prod_{i=0}^{q-3}(0!) = 1$$

and $(n-1-k)!=1!$, therefore $$f_{n-2}^{d_{n-2}} = 1,$$

otherwise $(d_{n-2} \leq d_{n-1})$, $$\sum_{d=0}^{d_{n-2}-1} w_{n-2}^d = 0$$

therefore $I_{n-2}^{d_{n-2}}=0$ with $P_{n-2}=2$ if $d_{n-2}=d_{n-1}$ and $P_{n-2}=1$ otherwise.

Other advantageous implementation details, described below, can also be provided for.

Elimination of a Division in Decoding

In order to avoid divisions in decoding when searching for $d_0$, the inequality (8) can be reformulated in the form:

$$(n-1)! \times \left(\sum_{d=0}^{d_0-1} w_0^d\right) \leq t \times \prod_{i=0}^{q-1}(w_0^i!) < (n-1)! \times \left(\sum_{d=0}^{d_0} w_0^d\right)$$

Similarly, the divisions are eliminated from the search for $d_1$ by reformulating the inequality (9) in the form:

$$(n-2)! \times \left(\sum_{d=0}^{d_1-1} w_1^d\right) \leq (t-t_0^{d_0}) \times \prod_{i=0}^{q-1}(w_1^i!) < (n-2)! \times \left(\sum_{d=0}^{d_1} w_1^d\right)$$

or even:

$$0 \leq (t-t_0^{d_0}) \times \prod_{i=0}^{q-1}(w_1^i!) - (n-2)! \times \left(\sum_{d=0}^{d_1-1} w_1^d\right) < (n-2)! \times w_1^{d_1}$$

It should be noted that, while it is thus possible to eliminate the divisions on searching for the $d_k$ ($0 \leq k \leq n-1$), it is still necessary to perform (n−1) divisions to calculate the $I_k^{d_k}$ ($0 \leq k \leq n-3$).

Test on the Weights on Decoding

In the last positions, for certain values of d, $w_k^d=0$ (for the $w_0^d$ components of value d occupying positions preceding the position k). It is therefore pointless calculating the terms of the inequalities (8) and (9) for these values of d.

Other Problem of the Prior Art: the Framing of the Variables

The problem of the framing of the variables has been tackled in the Applicant's TDAC encoder.

A first solution was to distinguish the processing operations on the dimensions greater than 12 from those on the smaller dimensions. For the small dimensions (n<12), the calculations are performed on unsigned integers on 32 bits. For the greater dimensions, double-precision floating variables are used at the cost of an increase in the calculation complexity (floating double precision operations are more expensive than their integer precision equivalents) and in the required memory capacity.

Furthermore, if the maximum precision is limited to unsigned 32-bit integers (implementation by a fixed-point processor), the integer factorials greater than 12 cannot be prestored directly and the vectors of dimension greater than 12 must be coded separately. To resolve this problem, a more sophisticated solution uses a pseudo-floating-point representation by mantissa and exponent of the factorials n! in the form $2^j \times r$. This decomposition is detailed in table 2 below. The storage of n! (for n less than or equal to 16) is reduced to storing r with a precision of 30 bits maximum as well as the exponent j which corresponds to a simple bit offset.

TABLE 2

Factorization of the factorials

| n | $\log_2$ (n!) | $2^j$ | r | $\log_2 r$ |
|---|---|---|---|---|
| 0 | 0 | 1 | 1 | 0 |
| 1 | 0 | 1 | 1 | 0 |
| 2 | 1.0000 | 2 | 1 | 0 |
| 3 | 2.5849625 | 2 | 3 | 1.5849625 |
| 4 | 4.5849625 | 8 | 3 | 1.5849625 |
| 5 | 6.9068906 | 8 | 15 | 3.9068906 |
| 6 | 9.4918531 | 16 | 45 | 5.4918531 |
| 7 | 12.299208 | 16 | 315 | 8.29920802 |
| 8 | 15.299208 | 128 | 315 | 8.29920802 |
| 9 | 18.469133 | 128 | 2835 | 11.469133 |
| 10 | 21.7910611 | 256 | 14175 | 13.7910611 |
| 11 | 25.2504927 | 256 | 155925 | 17.2504927 |
| 12 | 28.8354552 | 1024 | 467775 | 18.8354552 |
| 13 | 32.535895 | 1024 | 6081075 | 22.535895 |
| 14 | 36.3432499 | 2048 | 42567525 | 25.3432499 |
| 15 | 40.2501405 | 2048 | 638512875 | 29.2501405 |
| 16 | 44.2501405 | 32768 | 638512875 | 29.2501405 |

Thus, the techniques of the prior art, for the most part, do not solve the problem of the framing of the limited precision, in particular fixed point, variables. The implementation in the TDAC encoder, although it settles the framing problem, does not avoid the costly divisions of two integers. Furthermore, for high dimensions, the intermediate calculations (for example, the numerator and the denominator of the partial ranks $I_k^{d_k}$) can approach saturation. In this case, the simplifications described above cannot be used in the decoding processing and it is necessary to revert to the formulations of the inequalities (8) and (9), and therefore reintroduce numerous divisions.

The enumeration techniques other than the Schalkwijk technique suffer from the same problems. Given that they also use combinatorial analysis, they entail the calculation of products of factorials and their divisions.

The present invention aims to improve the situation.

To this end, it firstly proposes a method of encoding/decoding digital signals, using permutation codes involving a calculation of combinatorial expressions, in which these combinatorial expressions are represented by prime factor power decompositions, and determined by a memory reading of pre-recorded representations of decompositions of selected integer numbers.

The present invention then provides an effective solution to the problems associated with both the indexing of a permutation code and the reverse operation. It at the same time resolves the two problems that are the framing of the variables and the divisions.

In effect, in an advantageous implementation, the pre-recorded representations comprise values representative of exponents, respectively stored correlated with values representative of successive prime numbers, for each of said selected integers.

The problem associated with the framing of the variables in the prior art is thus already resolved.

This problem of framing of the variables is all the more acute when it comes to manipulating factorial terms.

In an advantageous implementation, to manipulate the combinatorial expressions when they comprise integer factorial values, the pre-recorded representations comprise at least representations of decompositions of factorial values.

This implementation then makes it possible to lift the constraint of framing of the variables and, from that, push back the limits usually set as to the dimension n of the permutation codes concerned.

According to another advantageous characteristic, at least one of said combinatorial expressions comprises a quotient of an integer number numerator by an integer denominator, and this quotient is represented by a prime factor power decomposition, of which each power is a difference of exponents respectively associated with the numerator and the denominator and assigned to one and the same prime number.

The problem associated with the calculation of divisions of the prior art is thus resolved, by replacing this calculation with a simple subtraction calculation.

In a first embodiment, provision is made for a memory addressing to retrieve a pre-recorded decomposition of one of the abovementioned selected integers. To this end, the pre-recorded representation of a selected integer number is stored in an addressable memory, an addressing of said memory giving a succession of exponents to be assigned to respective prime numbers to recompose the selected integer number.

Preferably, the pre-recorded representation of a selected integer number will be stored in the form of a succession of addresses, each giving, for a prime number, an exponent to be assigned to this prime number to recompose the selected integer number.

This implementation according to the first embodiment will be designated hereinafter "exploded representation of the decompositions".

As a variant, in a second embodiment, the pre-recorded representations are stored in the form of words comprising a succession of groups of bits, each group having:
    a weight dependent on a prime number, and
    a value dependent on an exponent to be associated with this prime number.

Preferably, the prime factor powers are then determined by successively applying at least one partial mask to the word of bits, with successive offsets according to the weights of the bits and readings of the remaining bits.

This implementation according to the second embodiment will hereinafter be designated "compact representation of the decompositions".

The same method process for the calculation of a combinatorial expression, can generally be conducted according to the following steps:
    identification, from said selected integer numbers, of terms appearing in a product and/or a quotient forming said combinatorial expression,
    reading in memory of the exponents involved in the prime factor decompositions of said terms,
    addition and/or respectively subtraction of the read exponents to determine the exponents involved in the prime factor power decomposition of said combinatorial expression, and, from that, calculate said combinatorial expression from its prime factor power decomposition.

Regarding the calculation of a product to be performed recurrently and involving a new term on each recurrence, it may be advantageous to temporarily store the decomposition of a product calculation performed for a prior recurrence. Thus, if the method comprises a recurrent step for calculation of a product involving on each recurrence a term being multiplied with a product determined on a prior recurrence:
    said product determined on a prior recurrence is advantageously retained in memory in the form of a prime factor power decomposition,
    said term being multiplied with the product is preferably one of the selected integers for which the decomposition is pre-recorded, and
    to determine said product on a current recurrence, it is sufficient to add together the exponents deriving from the respective decompositions of said product determined on a prior recurrence and of said term being multiplied with the product one by one for each prime number.

Similarly, if the method comprises a recurrent step for calculation of a division involving on each recurrence a term dividing a quotient determined on a prior recurrence:
    said quotient determined on a prior recurrence is advantageously retained in memory in the form of a prime factor power decomposition,
    said term dividing the quotient is preferably one of the selected integers for which the decomposition is pre-recorded, and
    to determine said division on a current recurrence, the exponents deriving from the decomposition of said term are subtracted, one by one for each prime number, from the exponents deriving from the decomposition of said quotient determined on a prior recurrence.

This temporary storage of the intermediate decompositions of the recurrently calculated products and/or quotients is particularly advantageous in determining recurrent partial ranks, the cumulation of which is representative of a rank of a permutation.

Thus, in an advantageous implementation of the invention, the permutation codes involve the calculation of a quantity representative of a rank of a permutation comprising a cumulation of partial ranks, each partial rank then corresponding to one of said combinatorial expressions.

The calculation of the rank of a permutation can then be used, when encoding vector-quantized digital signals, to index the permutations of the components of a leader vector (operation OP2 in FIG. 1A), these permutations having been performed in a prior step (operation OP1) to determine a code vector that is closest to an input vector.

Similarly, when decoding vector-quantized digital signals, the estimation of a rank of a permutation takes place given that, from a given value of a permutation rank:
    at least one quantity representative of a permutation rank approaching said given value is calculated (operation OP3 in FIG. 1A), according to at least one presumed component of a code vector to be constructed,
    the selection of the presumed component is validated if this quantity satisfies a condition of proximity with the given value of the rank.

In an exemplary implementation, this condition of proximity is satisfied if the given value of the rank can be bracketed by cumulations of partial ranks up to the partial rank associated with the presumed component, on the one hand, and up to the partial rank associated with a component corresponding to an incrementation of the presumed component, on the other hand.

This condition of proximity can therefore correspond to a general formulation of the inequalities (8) described above in the case of a Schalkwijk enumeration.

Thus, the present invention can advantageously be applied to the source encoding/decoding with vector quantization in the sense of FIG. 1A.

However, the encoding/decoding can also be of the channel modulation encoding/decoding type, in the sense of FIG. 1B, given that it comprises:

before transmission, the determination of a code vector from the rank of a permutation (same operation OP3 in FIG. 1A and in FIG. 1B), and in reception, the calculation of the rank of a permutation from a code vector corresponding to a received vector (same operation OP2 in FIG. 1A and FIG. 1B).

The calculation of a partial rank involves terms (in a product or a quotient) which, as a general rule as will be seen later, remain less than or equal to the maximum dimension n of the permutation codes. Thus, in a advantageous implementation, the selected integer numbers with pre-recorded decompositions comprise at least:

the integers between 1 and the maximum dimension n,
the factorial value of the integer 0,
and, preferably, the factorial values of the integers between 1 and the maximum dimension n.

In a particular optional implementation, the selected integer numbers can also comprise the value 0.

Thus, if the permutation code uses a Schalkwijk enumeration, a partial rank $I_k^{d_k}$ associated with the truncation $(y_k, \ldots, y_{n-1})$ of a code vector $(y_0, \ldots, y_{n-1})$ is expressed:

$$I_k^{d_k} = \frac{(n-1-k)!}{\prod_{i=0}^{q-1}(w_k^i!)} \left( \sum_{d=0}^{d_k-1} w_k^d \right), \text{ in which:}$$

the notation $$\prod_{i=0}^{m}$$

represents a product for an integer index i ranging from 0 to m, the notation $$\sum_{i=0}^{m}$$

represents a sum for an index i ranging from 0 to m, the notation l! is the factorial value of the integer l with $l!=1\times2\times3\times\ldots\times(l-1)\times l$, for $l>0$ and $0!=1$, the integer n is the dimension of the permutation code, corresponding to the total number of components that a code vector comprises, the integer k, between 0 and n−1, is the index of the kth component $y_k$ of the code vector, sought from a rank value in source decoding (respectively in channel encoding) or for which the permutations are to be indexed in source encoding (respectively in channel decoding), the integer q is the number of separate components that the code vector comprises, and a term $w_k^d$ (named "intermediate weight") represents the number of components with indices between k and n−1 and which have a value equal to that of one and the same index component d.

In this case, the selected integer numbers with pre-recorded decompositions and that are then to be identified in the expression of the partial rank $I_k^{d_k}$, in a product and/or a quotient, are preferably:

the factorial terms (n−1−k)!, for all the integers k and between 0 and n−1, (that is, the values of the factorials for all the integers between 0 and (n−1)), the value of each term $w_k^i$ and/or its factorial value, involved in the product $$P_k = \prod_{i=0}^{q-1}(w_k^i!),$$

each term $w_k^i$ being between 0 and n, and
the terms $$S_k = \sum_{d=0}^{d_k-1} w_k^d,$$

each between 1 and n−1, for all the integers k between 0 and n−1.

Still in the particular case of the Schalkwijk enumeration, the temporary storage of the intermediate decompositions is advantageously applied as to follows: the sum of the exponents in the decomposition of the term $$P_k = \prod_{i=0}^{q-1}(w_k^i!)$$

is temporarily stored in memory for a preceding index k, to add to it or subtract from it the exponents of the decomposition of a term $w_k^i$ for a current index k.

Figure 4:
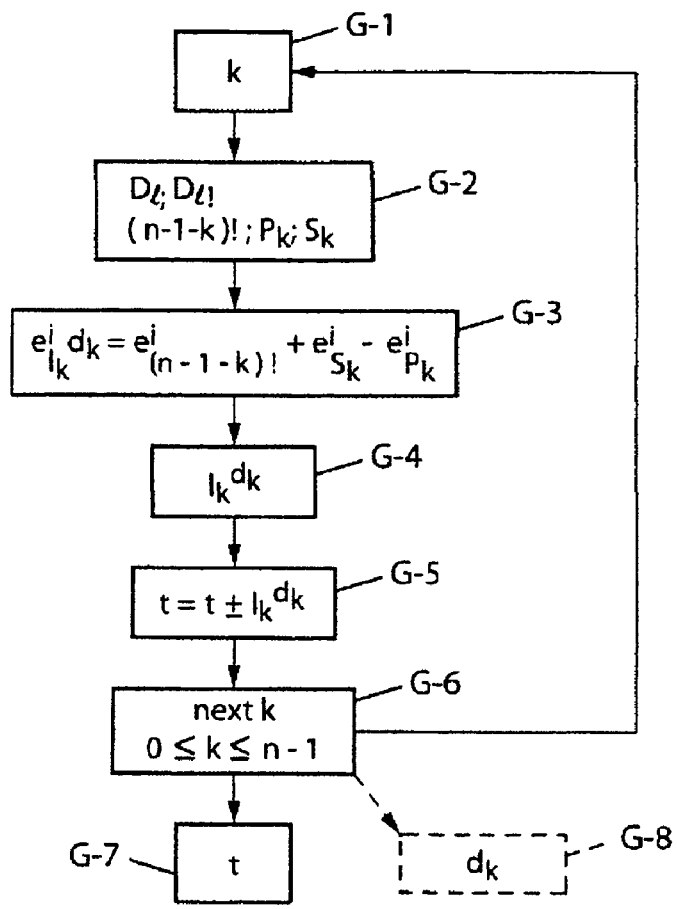
Figure 9:
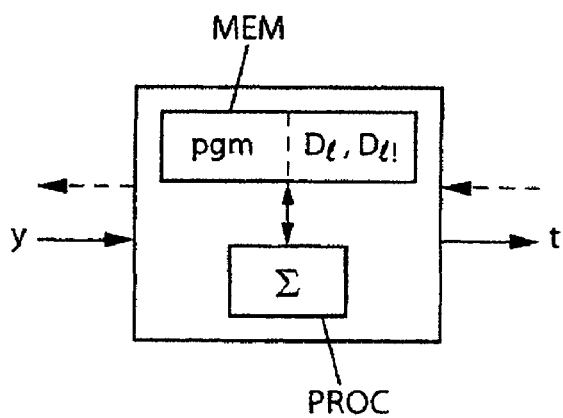
Figure 5:
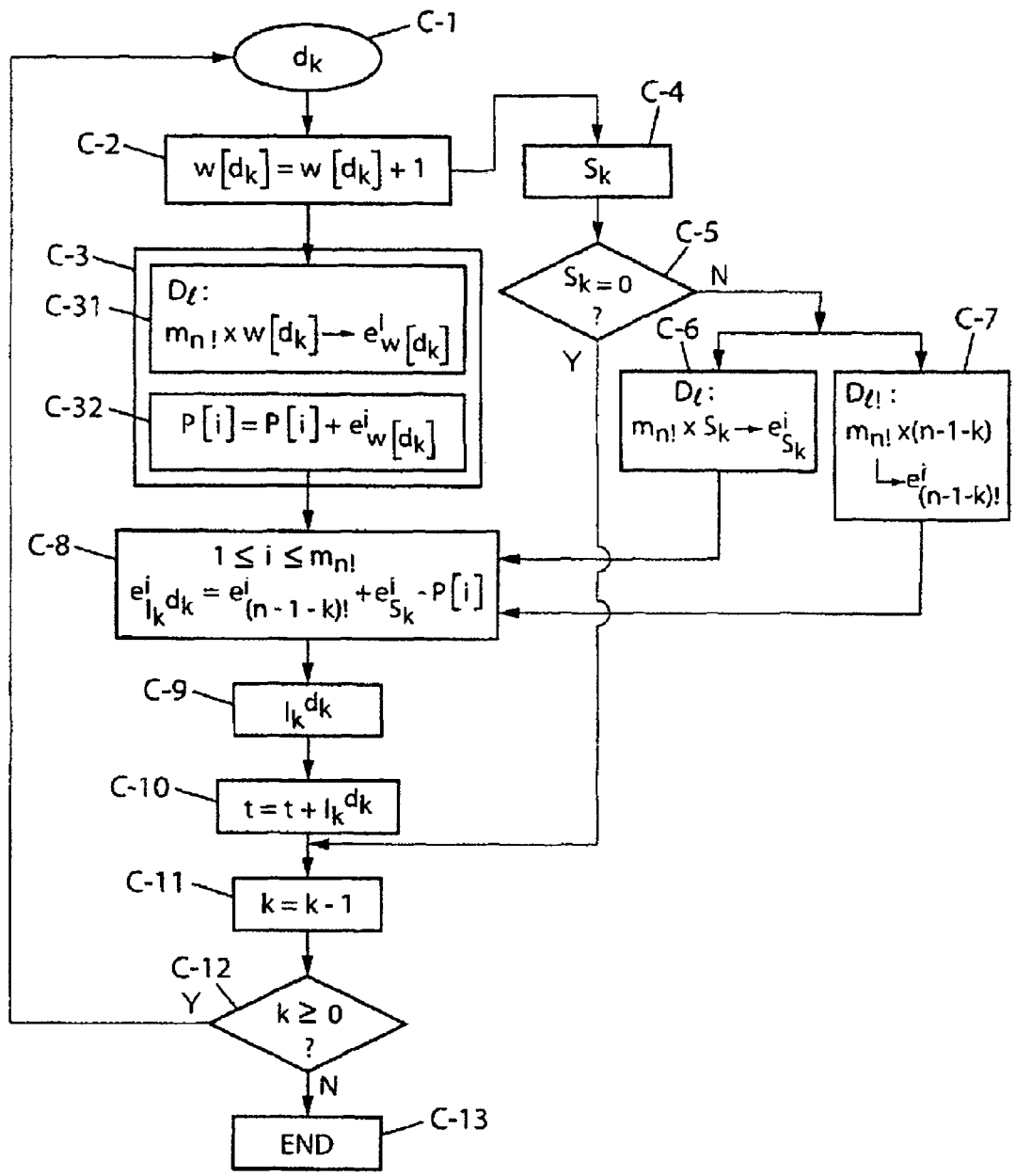
Figure 6:
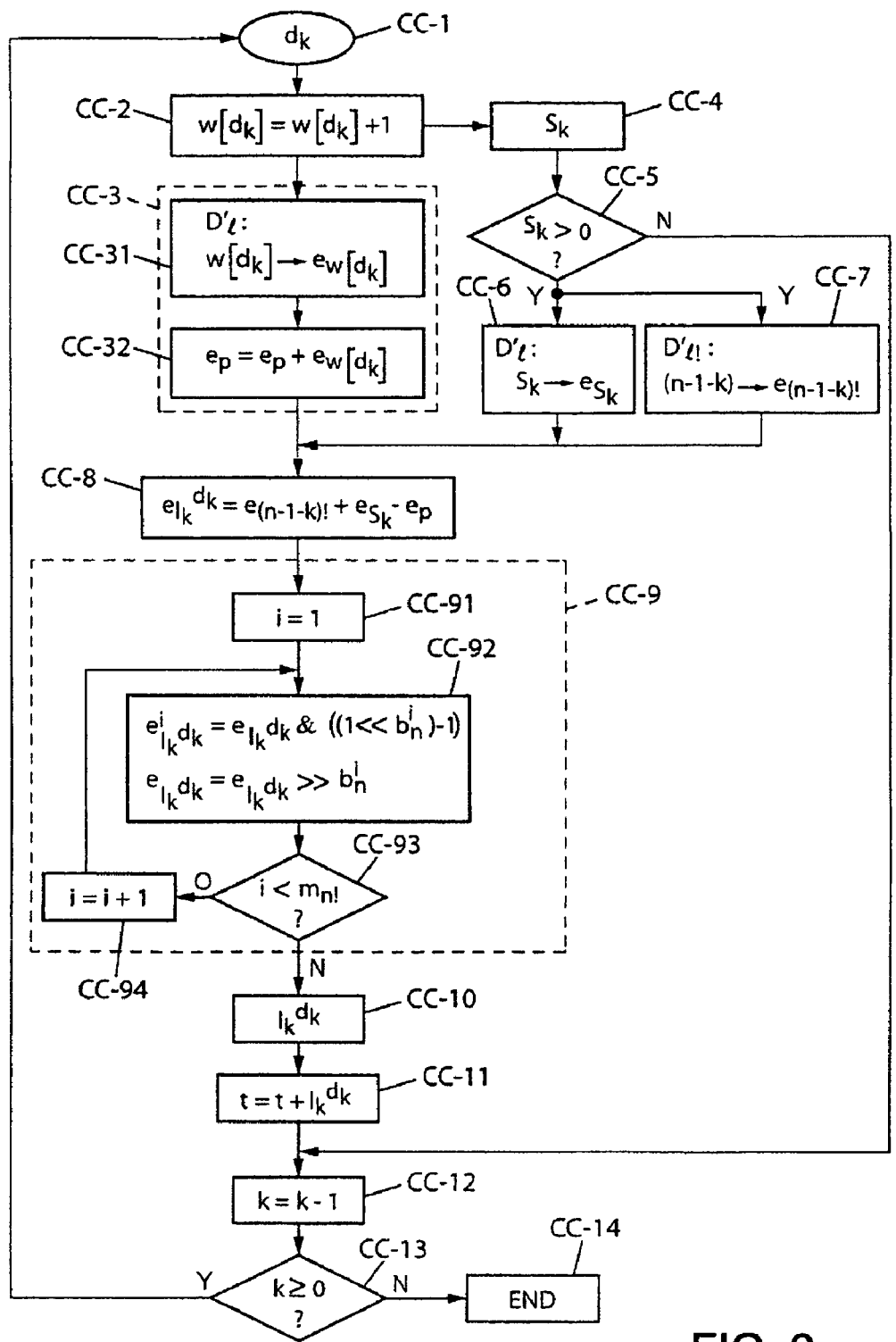
Figure 7:
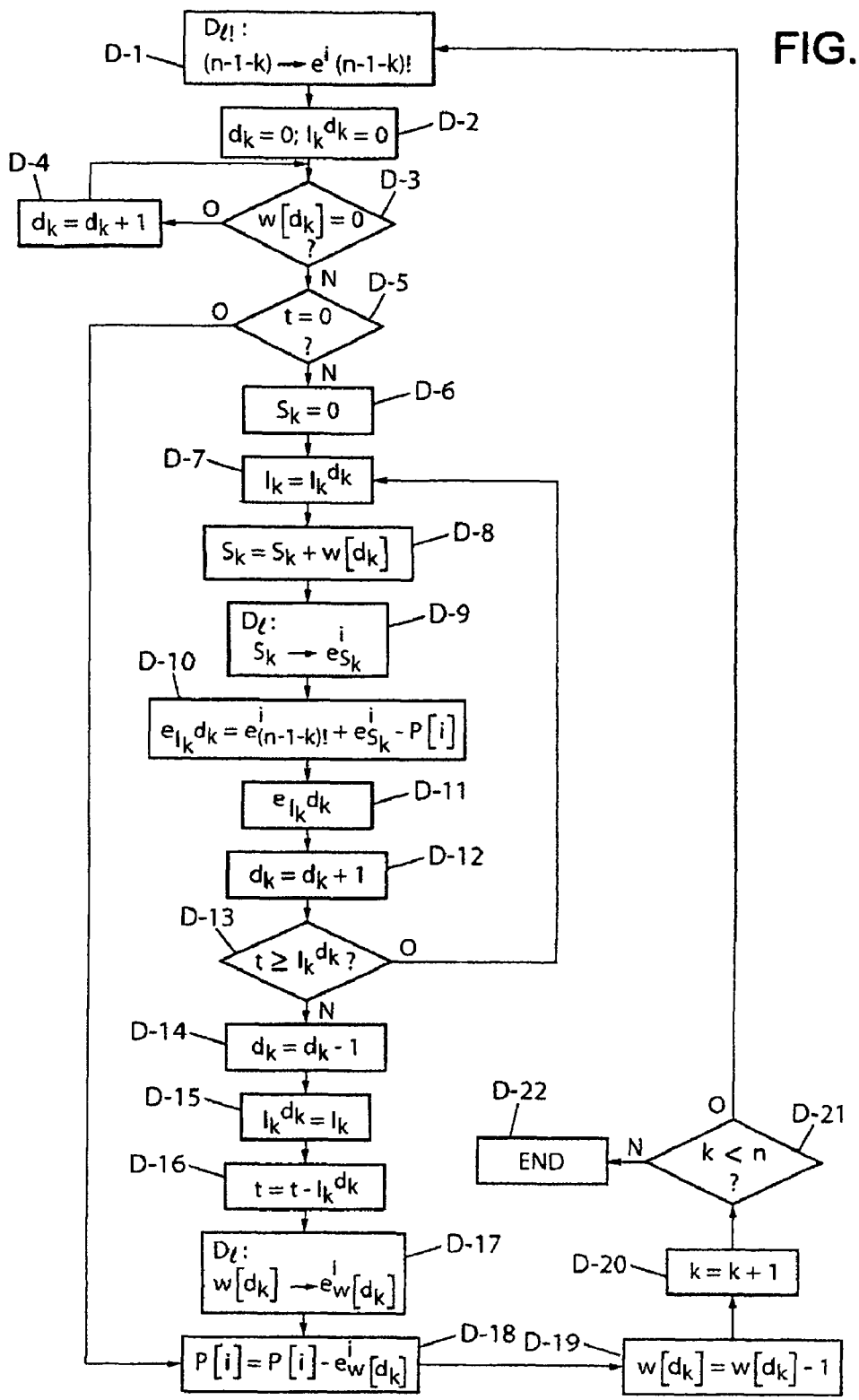
Figure 8:
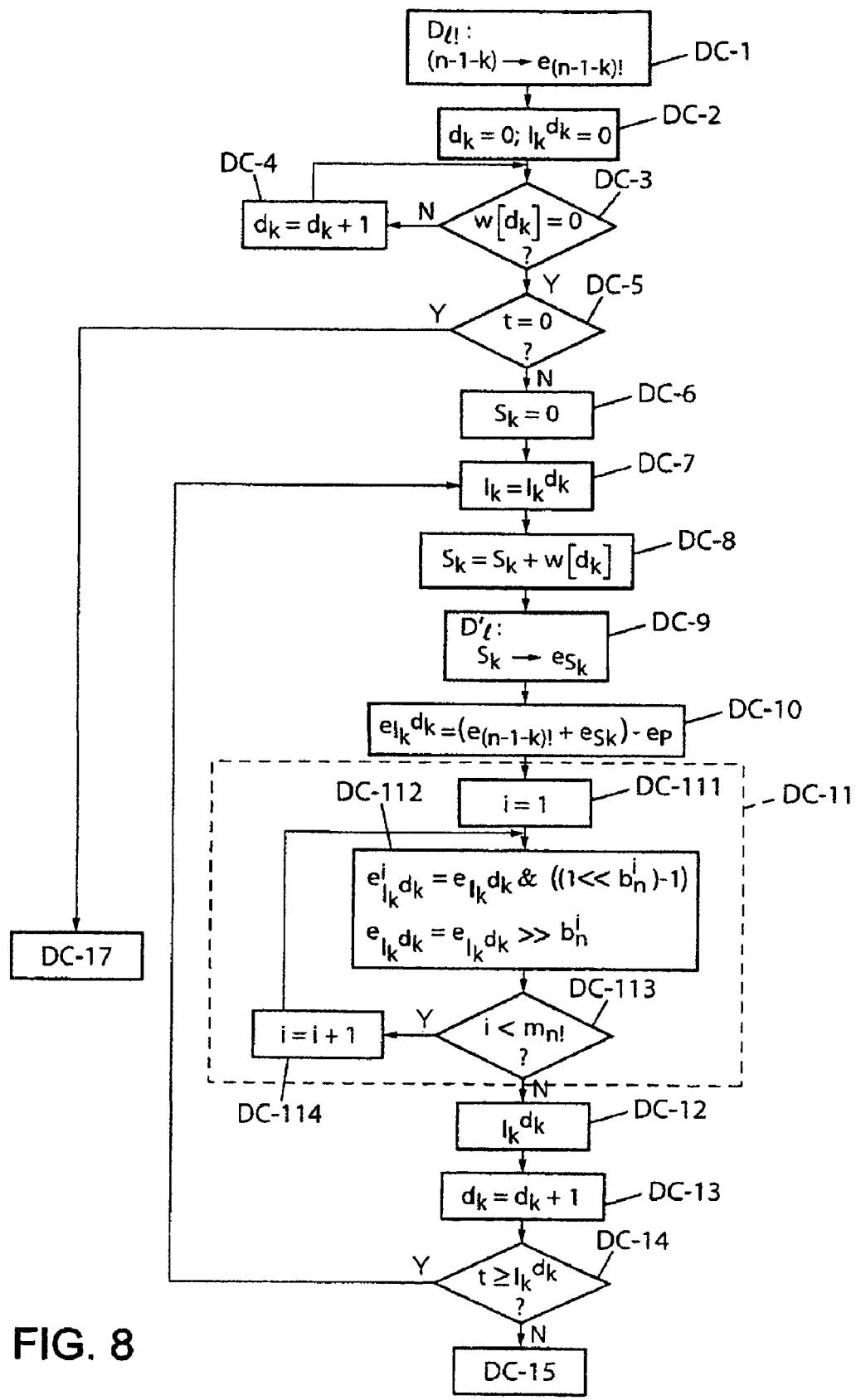
Figure 8:
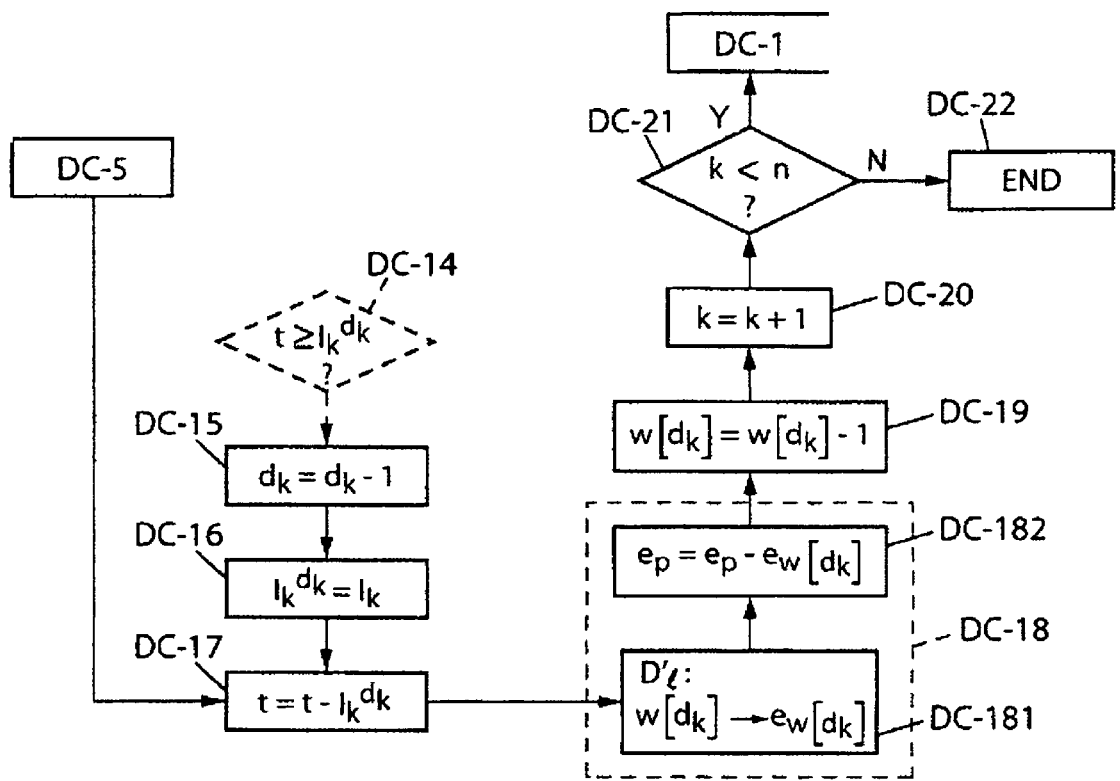

Other characteristics and advantages of the invention will become apparent from studying the detailed description below, and the appended drawings in which, in addition to FIGS. 1A, 1B, 2 and 3 described above:

FIG. 4 illustrates the principles of the encoding/decoding of the rank of a permutation by using the invention, FIG. 5 illustrates a processing operation for the encoding of a rank of a permutation by using the invention according to a first embodiment, in which there is provided an exploded representation of the exponents of the prime number power decomposition of terms used in this calculation, FIG. 6 illustrates a processing operation for the encoding of a rank of a permutation using the invention according to a second embodiment, in which there is provided a compact representation of the exponents of the decomposition, FIG. 7 illustrates a processing operation for the decoding of a rank of a permutation using the invention according to a first embodiment, in which there is provided an exploded representation of the exponents of the decomposition, and FIG. 8 illustrates a processing operation for the decoding of a rank of a permutation using the invention according to a second embodiment, in which there is provided a compact representation of the exponents of the decomposition, FIG. 9 diagrammatically represents an encoding/decoding device implementing the present invention.

As a reminder, and in particular with reference to FIGS. 4 to 8 below, it should be stressed that:

the term "encoding" is directed at the calculation of the rank t of a permutation (operation OP2 in FIGS. 1A and 1B), and the term "decoding" is directed at the determination of the permutation from this rank t (operation OP3 in FIGS. 1A and 1B).

These operations will be designated thus with reference to the source encoding/decoding with vector quantization. It should be remembered that these operations can also be conducted in channel encoding/decoding, in modulation.

To illustrate straight away the principle of the invention, the prime number power factorization is described below.

The decomposition of a non-zero positive integer number K, in prime number powers, is expressed thus:

$$K = \prod_{i=0}^{m_K} (p_i)^{e_K^i}$$

$p_i$ being an ith prime number ($p_0=1$, $p_1=2$, $p_2=3$, $p_3=5$, $p_4=7$, $p_5=11$, $p_6=13$, $p_7=17$, etc.).

The exponent of $p_i$ is denoted $e_K^i$ in the decomposition of the integer number K and $m_K$ denotes the index of the greatest prime factor involved in the decomposition of K with non-zero exponent.

For example, the number K=120 (or 5!) is expressed: $120=1\cdot 2^3 \cdot 3^1 \cdot 5^1$ and $m_K=3$ here since the greatest factor "5" is of index 3 ($p_3=5$). The following therefore applies: $e_{5!}^0=1$, $e_{5!}^1=3$, $e_{5!}^2=1$ and $e_{5!}^3=1$.

In practice, the number "1" being the neutral element of the multiplication, $p_0$ can be eliminated from the decomposition, i.e.:

$$K = \prod_{i=1}^{m_K} (p_i)^{e_K^i}$$

Of course, K=0 cannot be decomposed in prime factor powers.

The decomposition in products of prime number powers of the positive integers less than or equal to 16 is given in table 3a and the decomposition of their factorials is given in table 3b. This decomposition involves six prime numbers (2, 3, 5, 7, 11 and 13). Since the columns are indexed by the prime number $p_i$ and the rows by n, the cell of table 3a (respectively 3b) at the intersection of column $p_i$ and row n is the exponent $e_n^i$ (respectively $e_{n!}^i$) of the prime number $p_i$ in the prime number power product decomposition of the number n (respectively n!).

For any positive integer number n>1, the number $m_{n!}$ of prime factors of n! is such that: $p_{m_{n!}} \leq n \leq p_{m_{n!}+1}$. The number $m_{n!}$ (respectively the number $m_n$) has been indicated in the last (respectively penultimate) column of table 3b (respectively 3a). The following inequality should be noted: $m_n \leq m_{n!}$.

As table 3a shows, many exponents of the decomposition of a number n are zero. In the last column of table 3a, the number $m'_n$ of non-zero exponents in the decomposition of n has been noted. The absence of decomposition (and therefore of exponents) for n=0 is indicated in the row n=0 of table 3a by the "-" symbol.

TABLE 3a

Prime number power decomposition of a positive integer n (n < 17)

| n | 2 | 3 | 5 | 7 | 11 | 13 | $m_n$ | $m'_n$ |
|---|---|---|---|---|----|----|----|----|
| 0 | — | — | — | — | — | — | 0 | — |
| 1 | 0 | 0 | 0 | 0 | 0 | 0 | 1 | 0 |
| 2 | 1 | 0 | 0 | 0 | 0 | 0 | 1 | 1 |
| 3 | 0 | 1 | 0 | 0 | 0 | 0 | 2 | 1 |
| 4 | 2 | 0 | 0 | 0 | 0 | 0 | 1 | 1 |
| 5 | 0 | 0 | 1 | 0 | 0 | 0 | 3 | 1 |
| 6 | 1 | 1 | 0 | 0 | 0 | 0 | 2 | 2 |
| 7 | 0 | 0 | 0 | 1 | 0 | 0 | 4 | 1 |
| 8 | 3 | 0 | 0 | 0 | 0 | 0 | 1 | 1 |
| 9 | 0 | 2 | 0 | 0 | 0 | 0 | 2 | 1 |
| 10 | 1 | 0 | 1 | 0 | 0 | 0 | 3 | 2 |
| 11 | 0 | 0 | 0 | 0 | 1 | 0 | 5 | 1 |
| 12 | 2 | 1 | 0 | 0 | 0 | 0 | 2 | 2 |
| 13 | 0 | 0 | 0 | 0 | 0 | 1 | 6 | 1 |
| 14 | 1 | 0 | 0 | 1 | 0 | 0 | 4 | 2 |
| 15 | 0 | 1 | 1 | 0 | 0 | 0 | 3 | 2 |
| 16 | 4 | 0 | 0 | 0 | 0 | 0 | 1 | 1 |

TABLE 3b

Prime number power decomposition of n! (n < 17)

| n | n! | 2 | 3 | 5 | 7 | 11 | 13 | $m_{n!}$ |
|---|---|---|---|---|---|----|----|----|
| 0 | 1 | 0 | 0 | 0 | 0 | 0 | 0 | 1 |
| 1 | 1 | 0 | 0 | 0 | 0 | 0 | 0 | 1 |
| 2 | 2 | 1 | 0 | 0 | 0 | 0 | 0 | 1 |
| 3 | 6 | 1 | 1 | 0 | 0 | 0 | 0 | 2 |
| 4 | 24 | 3 | 1 | 0 | 0 | 0 | 0 | 2 |
| 5 | 120 | 3 | 1 | 1 | 0 | 0 | 0 | 3 |
| 6 | 720 | 4 | 2 | 1 | 0 | 0 | 0 | 3 |
| 7 | 5040 | 4 | 2 | 1 | 1 | 0 | 0 | 4 |
| 8 | 40320 | 7 | 2 | 1 | 1 | 0 | 0 | 4 |
| 9 | 362880 | 7 | 4 | 1 | 1 | 0 | 0 | 4 |
| 10 | 3628800 | 8 | 4 | 2 | 1 | 0 | 0 | 4 |
| 11 | 39916800 | 8 | 4 | 2 | 1 | 1 | 0 | 5 |
| 12 | 479001600 | 10 | 5 | 2 | 1 | 1 | 0 | 5 |
| 13 | 6227020800 | 10 | 5 | 2 | 1 | 1 | 1 | 6 |
| 14 | 87178291200 | 11 | 5 | 2 | 2 | 1 | 1 | 6 |
| 15 | 1307674368000 | 11 | 6 | 3 | 2 | 1 | 1 | 6 |
| 16 | 20922789888000 | 15 | 6 | 3 | 2 | 1 | 1 | 6 |

There follows a description of the application of such a decomposition to the calculation of a partial rank of a permutation code, in the case of the Schalkwijk formula initially, then in the general case.

It should be remembered that the partial rank, denoted $I_k^{d_k}$, is given by the relation (7) hereinabove:

$$I_k^{d_k} = \frac{(n-1-k)!}{\prod_{i=0}^{q-1}(w_k^i!)} \left( \sum_{d=0}^{d_k-1} w_k^d \right), \tag{7}$$

such that three terms can be decomposed in prime number powers. These are the terms:

$$(n-1-k)!, \quad P_k = \prod_{i=0}^{q-1} w_k^i! \quad \text{and} \quad S_k = \sum_{d=0}^{d_k-1} w_k^d.$$

From the exponents of the decompositions of (n−1−k)!, of $P_k$ and of $S_k$, the exponents of the decompositions of $I_k^{d_k}$ is calculated by simple additions and subtractions.

In effect, the exponent $$e^i_{I_k^{d_k}}$$

of a prime factor $p_i$ in the decomposition of $I_k^{d_k}$ is calculated from the three exponents of $p_i$ in the decompositions of the three terms (n−1−k)!, $S_k$ and $P_k$. The exponent $$e^i_{I_k^{d_k}}$$

is equal to the sum of the exponents of $p_i$ of the first two terms (numerator of $I_k^{d_k}$) from which the exponent of $p_i$ of the last term (denominator of $I_k^{d_k}$) is subtracted. This observation, once formalized, is expressed:

$$e^i_{I_k^{d_k}} = e^i_{(n-1-k)!} + e^i_{S_k} - e^i_{P_k} \tag{10}$$

FIG. 4 represents the general steps (referenced "G-n" to represent the nth general step) that can be involved in a processing operation in the sense of the invention both for encoding and for decoding.

Thus, with reference to FIG. 4, from a current index k (step G-1) and via some intermediate steps which will be described in detail later, it should above all be remembered that provision is made to refer to pre-recorded tables (denoted $D_t$ and $D_{t!}$ in the step G-2 illustrated by way of example in FIG. 4) to calculate the global exponent $$e_{I_k^{d_k}}$$

according to the relation (10) hereinabove (step G-3), this exponent being specific to the decomposition of the intermediate rank $I_k^{d_k}$ in prime factor powers. The value of the intermediate rank $I_k^{d_k}$ is then deduced from this (step G-4), possibly by conducting a loop on the index i specific to the prime factors. The calculation of this intermediate rank can then continue with an update of the total rank t of the permutation (step G-5):

with a relation of the type $t=t+I_k^{d_k}$ for the encoding of the rank with decrementing of the index k (step G-6), or with a relation of the type $t=t-I_k^{d_k}$ for the decoding of the rank with incrementing of the index k (step G-6), as will be seen later.

Finally, the rank t of the permutation is obtained, in encoding in the step G-7, or, in decoding (broken lines in FIG. 4), the components $d_k$ of the vector D are deduced from the inequalities of the formula (8) above in the step G-8 and from those of the vector Y by the relation $y_k=a_d$ hereinabove.

In the general case, and independently of the Schalkwijk enumeration, if a partial rank t' (t'>0) of a permutation is in the form of a numerator of $N_{t'}$ terms $v_j$ ($1 \leq j \leq N_{t'}$) and of a denominator of $D_{t'}$ terms $\rho_j$ ($1 \leq j \leq D_{t'}$), such that:

$$t' = \frac{\prod_{j=1}^{N_{t'}} v_j}{\prod_{j=1}^{D_{t'}} \rho_j},$$

then the exponents $e_{t'}^i$ of the decomposition of the partial rank t' are determined from the intermediate decompositions that are the decompositions of the $N_{t'} v_j$ and of the $D_{t'} \rho_j$, which is expressed:

$$e_{t'}^i = \sum_{j=1}^{N_{t'}} e^i_{v_j} - \sum_{j=1}^{D_{t'}} e^i_{\rho_j}$$

The decomposition in prime number factors will also be used hereinafter for a formulation in products of quotients of integer numbers of a partial rank t'.

Also as a general rule, if $$t' = \prod_{j=1}^{Q_{t'}} \frac{v_j}{\rho_j} = \prod_{j=1}^{Q_{t'}} \tau_j, \text{ then } e_{t'}^i = \sum_{j=1}^{N_{t'}} e^i_{\tau_j}.$$

To return to the particular case of the Schalkwijk enumeration, to then calculate a partial rank $I_k^{d_k}$ from its decomposition, once this decomposition has been determined, it can be carried out as follows. Keeping to the spirit of the relation $$e_{t'}^i = e^i_{I_k^{d_k}} = e^i_{(n-1-k)!} + e^i_{S_k} - e^i_{P_k},$$

the partial rank $I_k^{d_k}$ is calculated simply by multiplying the corresponding powers:

$$I_k^{d_k} = \prod_{i=1}^{m_{I_k^{d_k}}} (p_i)^{e^i_{I_k^{d_k}}}$$

It should be indicated here that the terms (n−1−k)! and $P_k$ are strictly positive integers but the term $S_k$ can be zero and therefore not decomposable. In this case, the partial rank $I_k^{d_k}$ is zero. A test is then provided on the value of the term $S_k$ ($S_k=0$?) to calculate the partial rank $I_k^{d_k}$ only if $S_k \neq 0$, as described hereinabove (step CA-11 in FIG. 3).

More generally, if $$e_{t'}^i = \sum_{j=1}^{N_{t'}} e^i_{v_j} - \sum_{j=1}^{D_{t'}} e^i_{\rho_j}, \text{ then}$$

$$t' = \prod_{i=1}^{m_{t'}} p_i^{e_{t'}^i} = \prod_{i=1}^{m_{t'}} p_i^{\sum_{j=1}^{N_{t'}} e^i_{v_j} - \sum_{j=1}^{D_{t'}} e^i_{\rho_j}}, \text{ and if}$$

$$e^i_{t'} = \sum_{j=1}^{Q_{t'}} e^i_{\tau_j}, \text{ then } t' = \prod_{i=1}^{m_{t'}} p_i^{e^i_{t'}} = \prod_{i=1}^{m_{t'}} p_i^{\sum_{j=1}^{Q_{t'}} e^i_{\tau_j}} \quad (t' > 0)$$

It will then be remembered that the prime factor factorization of the terms that make up a partial rank makes it possible to eliminate the divisions by replacing them with multiplications of prime factor powers, with, in particular, simple additions and subtractions of the exponents associated with these prime numbers.

Thus, in the sense of the present invention, the following steps are provided, from a limited number of prime factor decompositions of integer numbers, stored in memory (hereinafter called "basic decompositions"):

determination of the prime factor decompositions of terms (such as (n−1−k)!, $$P_k = \prod_{i=0}^{q-1} w^i_k! \text{ and } S_k = \sum_{d=0}^{d_k-1} w^d_k$$

appearing in the rank of a permutation (hereinafter called "intermediate decompositions"), in the sense of the step G-2 in FIG. 4, determination, from these intermediate decompositions, of the prime factor decomposition of a partial rank t'($I_k^{d_k}$) of a permutation, notably by the calculation of the exponents involved in the decomposition of this partial rank (with, for example, a relation of the type $$e^i_{I_k^{d_k}} = e^i_{(n-1-k)!} + e^i_{S_k} - e^i_{P_k}),$$

in the sense of the step G-3 in FIG. 4, and calculation of the partial rank t'($I_k^{d_k}$) from its decomposition (for example using a relation of the type $$I_k^{d_k} = \prod_{i=0}^{m_{I_k^{d_k}}} (p_i)^{e^i_{I_k^{d_k}}}),$$

in the sense of the step G-4 in FIG. 4.

Of course, the basic decompositions to be stored are preferably the subject of an advantageous selection. In a preferred but non-limiting implementation, the basic decompositions to be stored will be selected according to the maximum dimension of the permutation codes concerned (this maximum dimension being denoted n). Thus, the basic decompositions are preferably:

the decompositions of the factorials of an integer l (denoted l!), the integer l being such that $0 \leq l \leq n$, and the decompositions of the integer l itself, with, this time, $1 \leq l \leq n$, in which it will be remembered that n is the maximum dimension of the permutation codes concerned.

It is then possible to identify a basic decomposition by a number m giving:

the number m of prime factors to be considered, these m prime factors themselves, and their respective exponents.

Examples of this implementation will be described later with reference to tables 4a to 4d, in the context of a so-called "exploded" representation of the decompositions. It should be pointed out that a so-called "compact" representation, described in detail later, consists in storing a single word, the bits of which give all the exponents involved in a decomposition.

It is then possible to define different sets of basic decompositions, and the procedures for representing and storing these basic decompositions.

Moreover, the selection of the terms for which the intermediate decompositions are determined, and the determination proper of these intermediate decompositions, are the subject of advantageous implementations that will be described later. The decomposition of a partial rank and the calculation of a partial rank from its decomposition are also the subject of advantageous implementations described later.

There now follows a description of the selection of the basic decompositions to be stored.

Generally, and independently of the technique for enumerating a permutation code of dimension n, the calculation of the rank of a permutation uses the integer numbers l ($0 \leq l \leq n$) and above all their factorials l! ($0 \leq l \leq n$). In a preferred implementation, the basic decompositions are the decompositions of the factorials of l! ($0 \leq l \leq n$) and of l ($1 \leq l \leq n$) where n is the maximum dimension of the permutation codes concerned, as indicated hereinabove. (2n+1) basic decompositions are therefore provided in this preferred implementation.

Nevertheless, other implementations are possible.

For example, only (n+1) basic decompositions, namely those of l ($1 \leq l \leq n$) and of 0! need be provided. Thus, if a decomposition of l! (l>0) is necessary to the calculation of a partial rank, it is calculated in the step for determining the intermediate decompositions from the l basic decompositions of j ($1 \leq j \leq l$) with $$e^i_{l!} = \sum_{j=1}^{l} e^i_j.$$

Conversely, only the (n+1) decompositions of l! ($0 \leq l \leq n$) need be provided. If a decomposition of l (l>0) is necessary to the calculation of a partial rank, it is calculated in the step for determining the intermediate decompositions from the two basic decompositions of base of l! and (l−1)! and from the relation:

$$e^i_l = e^i_{l!} - e^i_{(l-1)!}$$

It will therefore be understood that the selection of the set of basic decompositions can advantageously result in a trade-off between minimizing the memory needed to store the representations of these basic decompositions and minimizing the complexity of the step for determining the intermediate decompositions.

Below is a description of a representation of the decompositions in the sense of the invention.

As indicated above, a decomposition (whatever the partial rank, intermediate or basic) is defined by a number m giving the number of prime factors to be considered, these m prime factors and their respective exponents. Different solutions are proposed below for representing the decompositions and storing the data for the basic decompositions.

Exploded Representation of the Exponents

Representation of the Factorials l! ($0 \leq l \leq n$)

The number $m_{l!}$ of prime factors involved in the decomposition of the value l! increases with the number l. A first solution for representing the decomposition of l! ($0 \leq l \leq n$) consists in storing for each value of l ($0 \leq l \leq n$) the number $m_{l!}$ and the $m_{l!}$ exponents of the powers of $p_i$ ($1 \leq i \leq m_{l!}$). It will be noted that the $m_{l!}$ exponents of l! are non-zero.

In a more advantageous variant, the set of the basic decompositions shares the same number $m_{n!}$ of prime factors and $m_{n!}$ exponents are stored for each basic decomposition, the exponents of the basic decomposition of l! of index greater than $m_{l!}$ being zero. This solution makes it possible to make use of a table of the exponents by providing a regular addressing of this table. However, such an implementation requires a considerable memory size. This table comprises $m_{n!} \times (n+1)$ values and the exponent $e_{l!}^i$ is stored at the address ($m_{n!}$, l+(i−1)) of this table, in which the notation (x, y) targets the cell of this table on the row x and in the column y. Of course, it will be understood that other conventions can be considered. Thus, instead of considering a two-dimensional table with m columns and N lines with therefore comprises m×N cells (or elements), it is possible to consider a one-dimensional table having m×N cells, the cell at the address (x, y) of the two-dimensional table then being located at the address m×x+y of the one-dimensional table. The exponent $e_{l!}^i$ stored at the address (l,(i−1)) of the two-dimensional table is then stored at the address ($m_{n!} \times l+(i-1)$) of the one-dimensional table. For example, the exponents of the decompositions of the factorials of the numbers 0 to 8 can be stored in the two-dimensional table comprising 36 cells, consisting of 4 columns (columns $p_i$=2, 3, 5, 7) of table 3b and 9 rows (rows n=0, . . . 8). These same exponents can be stored in a single-dimensional table $D_{l!}$ with 36 cells, given hereinbelow (appendix A-11). The cell at the address (x, y) of the first table being equal to the cell at the address $D_{l!}$: 4×x+y.

In addition, provision can be made to store the (n+1) values of $m_{l!}$ to be able to reduce the calculations of the intermediate decompositions using the basic decomposition of l!.

Representation of the Integers l ($1 \leq l \leq n$)

To represent the basic decomposition l ($1 \leq l \leq n$), several solutions can also be provided for. A first solution is to store, for each value l, the number $m_l$ and the $m_l$ exponents of the powers of $p_i$ ($1 \leq i \leq m_l$) of l. In a variant, it may be preferred to store as many exponents as for l! ($m_{l!}$ or $m_{n!}$) exponents. The basic decompositions of l and l! then share the same number m.

In another variant, the fact that the number $m'_l$ of non-zero exponents of the decomposition of l is low can be exploited. For example, it was apparent in table 3a that this number $m'_l$ was at most 2 (for $l \leq 16$). Thus, it is possible to store only this number and the corresponding values $p_i$ or the indices i.

However, it is also necessary to provide for storing the indices i of these prime factors of non-zero power because they are no longer implicitly recognized by the address of the corresponding exponent in the table.

Representation of a Decomposition Other than a Basic Decomposition

The representation of an intermediate decomposition depends on the representation of the basic decompositions from which it is determined. Similarly, the representation of a decomposition of a partial rank depends on the representation of the intermediate decompositions from which it is determined.

Storage of the Basic Decompositions

Typically, four possible storage solutions can be illustrated by way of example by tables 4a to 4d hereinbelow for a permutation code of dimension 8 (n=8) in which four ($m_{8!}$=4) prime numbers (2, 3, 5 and 7) are considered. These examples can be applied to the 3GPP AMR-WB+ encoder (standards [3GPPTS26.273] and [3GPPTS26.304]). This encoder uses an algebraic vector quantization, the dictionary of which is a union of the permutation codes of the Gosset array $RE_8$ of dimension 8.

The first three solutions (tables 4a-4c) represent and store the basic decompositions of l! in the same way. In effect, a storage of $m_{l!}$ and of the $m_{l!}$ exponents of the powers of $p_i$ ($1 \leq i \leq m_{l!}$) of l! is provided. They differ in the representation and the storage of the basic decompositions of l. Table 4a shows a first solution targeting the storage of $m_l$ and of the $m_l$ exponents of the powers of $p_i$ ($1 \leq i \leq m_{l!}$) of l. Table 4b shows a second solution targeting the storage of the $m_{l!}$ exponents of the powers of $p_i$ ($1 \leq i \leq m_{l!}$) of l.

TABLE 4a

First solution for a storage of the prime number power decomposition of l and l! and for a permutation code of dimension 8 (l ranging from 0 to 8)

| | l! | | | | | l | | | | |
|---|---|---|---|---|---|---|---|---|---|---|
| | | | | | | | $p_i$ | | | |
| l | 2 | 3 | 5 | 7 | $m_{l!}$ | 2 | 3 | 5 | 7 | $m_l$ |
| 0 | 0 | — | — | — | 1 | — | — | — | — | 0 |
| 1 | 0 | — | — | — | 1 | 0 | — | — | — | 1 |
| 2 | 1 | — | — | — | 1 | 1 | — | — | — | 1 |
| 3 | 1 | 1 | — | — | 2 | 0 | 1 | — | — | 2 |
| 4 | 3 | 1 | — | — | 2 | 2 | — | — | — | 1 |
| 5 | 3 | 1 | 1 | — | 3 | 0 | 0 | 1 | — | 3 |
| 6 | 4 | 2 | 1 | — | 3 | 1 | 1 | — | — | 2 |
| 7 | 4 | 2 | 1 | 1 | 4 | 0 | 0 | 0 | 1 | 4 |
| 8 | 7 | 2 | 1 | 1 | 4 | 3 | — | — | — | 1 |

TABLE 4b

Second solution for the storage of the prime number power decomposition of l and l! and for a permutation code of dimension 8 (l ranging from 0 to 8)

| | l! | | | | l | | | | |
|---|---|---|---|---|---|---|---|---|---|
| | | | | | | $p_i$ | | | |
| l | 2 | 3 | 5 | 7 | 2 | 3 | 5 | 7 | $m_{l!}$ |
| 0 | 0 | — | — | — | — | — | — | — | 1 |
| 1 | 0 | — | — | — | 0 | — | — | — | 1 |
| 2 | 1 | — | — | — | 1 | — | — | — | 1 |
| 3 | 1 | 1 | — | — | 0 | 1 | — | — | 2 |
| 4 | 3 | 1 | — | — | 2 | 0 | — | — | 2 |
| 5 | 3 | 1 | 1 | — | 0 | 0 | 1 | — | 3 |
| 6 | 4 | 2 | 1 | — | 1 | 1 | 0 | — | 3 |
| 7 | 4 | 2 | 1 | 1 | 0 | 0 | 0 | 1 | 4 |
| 8 | 7 | 2 | 1 | 1 | 3 | 0 | 0 | 0 | 4 |

Table 4c below shows a third solution targeting the storage of the number $m'_l$ of non-zero exponents of the powers of $p_i$ of l, of the corresponding indices i and their exponents. In the table represented, for greater clarity, it is the prime factors $p_i$ that are indicated.

TABLE 4c

Third solution for the storage of the prime number power decomposition of l and l! and for a permutation code of dimension 8 (l ranging from 0 to 8)

| | l! | | | | | l | | | | |
|---|---|---|---|---|---|---|---|---|---|---|
| | | | | | | | $p_i$ | | | |
| l | 2 | 3 | 5 | 7 | $m_{l!}$ | $p_i$ | $e^i$ | $p_{i'}$ | $e^{i'}$ | $m'_l$ |
| 0 | 0 | — | — | — | 1 | — | — | — | — | 0 |
| 1 | 0 | — | — | — | 1 | 2 | 0 | — | — | 1 |

TABLE 4c-continued

Third solution for the storage of the prime number power
decomposition of l and l! and for a permutation code of dimension 8
(l ranging from 0 to 8)

| | l! | | | | | l | | | | |
|---|---|---|---|---|---|---|---|---|---|---|
| | | | | | | $p_i$ | | | | |
| l | 2 | 3 | 5 | 7 | $m_{l!}$ | $p_i$ | $e^i$ | $p_{i'}$ | $e^{i'}$ | $m'_l$ |
| 2 | 1 | — | — | — | 1 | 2 | 1 | — | — | 1 |
| 3 | 1 | 1 | — | — | 2 | 3 | 1 | — | — | 1 |
| 4 | 3 | 1 | — | — | 2 | 2 | 2 | — | — | 1 |
| 5 | 3 | 1 | 1 | — | 3 | 5 | 1 | — | — | 1 |
| 6 | 4 | 2 | 1 | — | 3 | 2 | 1 | 3 | 1 | 2 |
| 7 | 4 | 2 | 1 | 1 | 4 | 7 | 1 | — | — | 1 |
| 8 | 7 | 2 | 1 | 1 | 4 | 2 | 3 | — | — | 1 |

In a fourth solution (illustrated by table 4d below), the set of the basic decompositions is represented by the number $m_{n!}$ and, for each basic decomposition (l or l!), $m_{n!}$ exponents are stored. Table 4d is extracted from the four columns ($p_i$=2, 3, 5 and 7) and the 9 rows (n=0 to 8) of tables 3a and 3b given previously.

TABLE 4d

Fourth solution for the storage of prime number power
decomposition of l and l! and for a permutation code of dimension 8
(l ranging from 0 to 8)

| | l! | | | | l | | | |
|---|---|---|---|---|---|---|---|---|
| | | | | | $p_i$ | | | |
| l | 2 | 3 | 5 | 7 | 2 | 3 | 5 | 7 |
| 0 | 0 | 0 | 0 | 0 | — | — | — | — |
| 1 | 0 | 0 | 0 | 0 | 0 | 0 | 0 | 0 |
| 2 | 1 | 0 | 0 | 0 | 1 | 0 | 0 | 0 |
| 3 | 1 | 1 | 0 | 0 | 0 | 1 | 0 | 0 |
| 4 | 3 | 1 | 0 | 0 | 2 | 0 | 0 | 0 |
| 5 | 3 | 1 | 1 | 0 | 0 | 0 | 1 | 0 |
| 6 | 4 | 2 | 1 | 0 | 1 | 1 | 0 | 0 |
| 7 | 4 | 2 | 1 | 1 | 0 | 0 | 0 | 1 |
| 8 | 7 | 2 | 1 | 1 | 3 | 0 | 0 | 0 |

In the TDAC encoder which uses a statistical vector quantization with variable dimension and resolution, of maximum dimension 15, six ($m_{15!}$=6) prime numbers are considered: 2, 3, 5, 7, 11 and 13. The 6 columns ($p_i$=2, 3, 5, 7, 11 and 13) and the 16 rows (n=0 to 15) of tables 3a and 3b can then illustrate the storage of the set of the basic representations for the fourth solution.

Compact Representation of the Exponents

There follows a description of another advantageous solution that minimizes the storage and that consists in compactly representing the exponents of a basic decomposition on a limited number of words. In this variant of representation of the basic decompositions, the intermediate decompositions and those of the partial ranks are also represented compactly. Advantageously, this solution also minimizes the complexity of the determination of these decompositions, as will be seen.

Compact Representation of the Decompositions

A search is conducted to determine, for each prime factor $p_i$, an upper limit $\beta_i$ of the maximum value of its exponent in the numerator of the partial ranks. This limit gives the maximum number of possible values of the exponent of $p_i$, namely $\beta_i+1$. By using $b_n^i$ denote the integer number of bits to represent the value ($\beta_i+1$) in binary fashion, we obtain:

$$b_n^i = \lceil \log_2(\beta_i + 1) \rceil \text{ and } B_n^i = \sum_{j=1}^{i-1} b_n^j \text{ (with } B_n^1 = 0\text{)}$$

in which $\lceil x \rceil$ denotes the integer immediately greater than or equal to x ($\lceil x \rceil - 1 < x \leq \lceil x \rceil$).

The exponents of the power factor decomposition of a term K involved in a partial rank t' can be represented compactly by a word $e_K$ of $B_n$ bits $$\left( B_n = \sum_{i=1}^{m_{n!}} b_n^i \right),$$

this word $e_K$ being such that:

$$e_K = \sum_{i=1}^{m_{n!}} (e_K^i \ll B_n^i)$$

The notation "<<B" represents a left shift of B bits.

It will be noted that if the number n is great, it may be that $B_n$ is greater than the number of bits $B_0$ used to represent integers (16, 32 or 40 bits). In this case, the exponents of the prime factor decomposition of an integer K involved in t' are represented in the form of M whole words $e_K(m)$, $0 \leq m < M$ (with, of course, M>1).

Advantageously, the M words can be formed as follows:
$e_K(0)$ comprises the $i_0$ first exponents (exponents from $p_1$ to $p_{i_0}$):

$$e_K(0) = \sum_{i=1}^{i_0} e_K^i \ll B_n^i$$

in which $B_n^{i_0+1} < B_0 \leq B_n^{i_0+1}$.

$e_K(1)$ comprises the exponents from $p_{i_0+1}$ to $p_{i_1}$:

$$e_K(1) = \sum_{i=i_0+1}^{i_1} e_K^i \ll (B_n^i - B_n^{i_0+1})$$

in which $(B_n^{i_1+1} - B_n^{i_0+1}) < B_0 \leq (B_n^{i_1+2} - B_n^{i_0+1})$

The latter relation can be generalized for any m, until the last word is composed that comprises the exponent of $p_{m_{n!}}$ Of course, other variants can be provided. For example, one variant consists in separately storing the exponent of $p_1$ and applying the above processing operation from the exponent of $p_2$.

Determination of the Upper Limit

The limits $\beta_i$ can be determined in a number of ways. Using the information on the permutation code (size q of the alphabet, weight $w_i$, $0 \leq i < q$), the maximum value of each exponent of the numerator of a partial rank can be explicitly determined. If a number of permutation codes (possibly of different dimensions) are used, the greatest of the maximum values is preferably chosen for each exponent.

The present invention advantageously proposes a general processing operation to determine the upper limit in the context of the Schalkwijk enumeration. The processing operation uses no a priori information on the permutation codes used other than the maximum dimension. It simply uses the relation:

$$\max_{0\leq k\leq n} (e^i_{(n-1-k)!} + e^i_{S_k}) \leq \max_{0\leq k<n}(e^i_{(n-1-k)!}) + \max_{1\leq l<n}(e^i_l) = e^i_{(n-1)!} + \max_{1\leq l<n}(e^i_l)$$

to then choose $$\beta_i = e^i_{(n-1)!} + \max_{1\leq l<n}(e^i_l).$$

This very general processing is particularly suitable when a large variety of permutation codes is used.

Table 5a gives the upper limits of the maximum values of the exponents in the numerators of $I_k^{d_k}$ for the dimensions 8 and 15. Table 5b gives the number of bits $b_n^i$ represent these exponents for the dimensions 8 and 15, and their sum $B_n$ (last column). In dimension 8, the exponent of the prime factor 2 is represented on 3 bits, the exponents of the other prime factors (3, 5 and 7) being represented on 2 bits. In dimension 15, the exponent of the prime factor 2 is represented on 4 bits, the exponent of the prime factor 3 on 3 bits, the exponents of the other prime factors (5, 7, 11 and 13) being represented on 2 bits.

TABLE 5a upper limits of the exponents of the numerators for the permutation codes of dimensions 8 and 15

| | $p_i$ | | | | | |
|---|---|---|---|---|---|---|
| n | 2 | 3 | 5 | 7 | 11 | 13 |
| 8 | 6 | 3 | 2 | 2 | — | — |
| 15 | 14 | 7 | 3 | 3 | 2 | 2 |

TABLE 5b

Number of bits to represent the exponents for the permutation codes of dimensions 8 and 15

| | $p_i$ | | | | | | |
|---|---|---|---|---|---|---|---|
| n | 2 | 3 | 5 | 7 | 11 | 13 | $B_n$ |
| 8 | 3 | 2 | 2 | 2 | — | — | 9 |
| 15 | 4 | 3 | 2 | 2 | 2 | 2 | 15 |

Table 6a (respectively 6b) gives the compact representation of the exponents of l and l! for the dimension n equal to 8 (respectively 15).

TABLE 6a

Compact representation of the exponents for the permutation codes of dimension 8

| | l | | | | | | | |
|---|---|---|---|---|---|---|---|---|
| | 0 | 1 | 2 | 3 | 4 | 5 | 6 | 7 | 8 |
| $e_l$ | — | 0 | 1 | 8 | 2 | 32 | 9 | 128 | 3 |
| $e_{l!}$ | 0 | 0 | 1 | 9 | 11 | 43 | 52 | 180 | 183 |

TABLE 6b

Compact representation of the exponents for the permutation codes of dimension 15

| | l | | | | | | | |
|---|---|---|---|---|---|---|---|---|
| | 0 | 1 | 2 | 3 | 4 | 5 | 6 | 7 |
| $e_l$ | — | 0 | 1 | 16 | 2 | 128 | 17 | 512 |
| $e_{l!}$ | 0 | 0 | 1 | 17 | 19 | 147 | 164 | 676 |
| | l | | | | | | | |
| | 8 | 9 | 10 | 11 | 12 | 13 | 14 | 15 |
| $e_l$ | 3 | 32 | 129 | 2048 | 18 | 8192 | 513 | 144 |
| $e_{l!}$ | 679 | 711 | 840 | 2888 | 2906 | 11098 | 11611 | 11755 |

As a purely illustrative example, let us try to determine the decomposition of the integer l=12 using table 6b.

Preferably, in table 6b, since the maximum dimension of the codes is n=15, the exponent of "2" is represented on 4 bits, that of "3" on 3 bits, and the other prime factors 5, 7, 11, 13 on 2 bits. In the table, in the column l=12, its compact exponent $e_{12}=18$ can be read.

Relying on the reading of the table below, the binary representation of 18 (=16+2) on $B_{15}=15$ bits is: 000 0000 0001 0010, i.e. 00 00 00 00 001 0010 by grouping together the bits associated with one and the same prime number.

| i | 15...7 | 6 | 5 | 4 | 3 | 2 | 1 | 0 |
|---|---|---|---|---|---|---|---|---|
| $2^i$ | ... | 64 | 32 | 16 | 8 | 4 | 2 | 1 |
| In binary representation, 18 is expressed: | 0...0 | 0 | 0 | 1 | 0 | 0 | 1 | 0 |

The 4 low order bits (weights i=0 to 3) are the exponent of the prime factor 2, i.e.: 0010=2, which means that 2 is the exponent to be assigned to the prime number 2.

The next 3 bits (weights i=4 to 6) are the exponent of the prime factor 3, i.e.: 001=1, which means that 1 is the exponent to be assigned to the prime number 3.

The next 2 bits (weights i=7 to 8) are the exponent of the prime factor 5, i.e.: 00=0

The next 2 bits (weights i=9 to 10) are the exponent of the prime factor 7, i.e.: 00=0

The next 2 bits (weights i=7 to 12) are the exponent of the prime factor 11, i.e.: 00 =0

The next 2 bits (weights i=13 to 14) are the exponent of the prime factor 13, i.e.: 00=0

The extraction procedure entails masking the high order bits to recover the exponent of the prime factor contained in the low order bits, then shifting the compact exponent of the number of bits recovered to switch to the exponent of the next prime factor.

Thus, in dimension 15, there are 6 exponents to be extracted, beginning with the exponent of 2.

The binary representation of the exponent of 2 corresponds to the 4 lower order bits of 18, i.e. 0 0 1 0 which corresponds to 2. To recover them, the high order bits of 18 are masked with 15 (denoted 18 & 15), which is equivalent to: $2^4-1=1\ 1\ 1\ 1$.

The result obtained is $e_{12}=18$ & $(2<<4-1)=2$, which means that 2 is the exponent to be assigned to the prime number 2.

Then 18 is shifted 4 bits to the right, giving: 000 0000 0001=1

The binary representation of the exponent of 3 corresponds to the three low order bits of 1, i.e. 0 0 1 (=1). To recover them, the high order bits of 1 are to masked by 7 (denoted 1 & 7 and with the value $2^3-1=1\ 1\ 1$).

The result obtained is $e^1_{12}=1\ \&\ (2<<3-1)=1$, which means that 1 is the exponent to be assigned to the prime number 3.

Then 1 is shifted 2 bits to the right, which then gives: 0000 0000=0 for all the other high order bits.

It will therefore be recalled that the powers of l=12 are:

2 for the prime number 2, and 1 for the prime number 3, i.e. $l=12=2^2\times3^1$ Upper Limit for the Denominator It is assumed here that, for each prime factor, its exponent in the denominator of a partial rank t' is less than or equal to its exponent in the numerator of t'. Such is the case if t' is strictly positive because $e_{t'}{}^i=(e_{(Num(t'))}{}^i-e_{(Den(t'))}{}^i)\geqq0$, therefore $e_{(Num(t'))}{}^i\geqq e_{(Den(t'))}{}^i$.

In practice, with the Schalkwijk formula, and if q>1, the value $e_{(n-1)!}{}^i$ is an upper limit of the maximum value $\beta'_i$ of the exponent of the denominator $P_k$ ($P_k\leqq(n-1)!$ if q>1).

It is therefore sufficient to check the inequality $e_{(n-1)!}{}^i<2^{b_n{}^i}$, which is already done by the processing operation determining the value of $\beta_i$ explained above.

In the other cases, it is possible to search explicitly for $\beta'_i$ and calculate $b_n{}^i$ using the maximum of $\beta_i$ and $\beta'_i$.

In the case where q=1, it will be understood that a single code word of known rank (t=0) is involved in the permutation code and it is therefore useless a priori to perform the rank calculations and the corresponding reverse operations. However, if there is no desire to deal with this particular case to separately, provision can still be made to calculate the value $b_n{}^i$ by the maximum of $\beta_i$ and $e_{n!}{}^i$. Table 7 below illustrates this case for n=16.

TABLE 7

Calculating the upper limit of the numerator $\beta_i$ and of $b_{16}{}^i$ ($1\leqq i\leqq 6$) for permutation codes of dimension 16

| $p_i$ | 2 | 3 | 5 | 7 | 11 | 13 |
|---|---|---|---|---|---|---|
| $\max_{1\leq l<16}(e_l^j)$ | 3 | 2 | 1 | 1 | 1 | 1 |
| $e_{15!}{}^i$ | 11 | 6 | 3 | 2 | 1 | 1 |
| $\beta_i = e_{15!}^i + \max_{1\leq l<16}(e_l^j)$ | 14 | 8 | 4 | 3 | 2 | 2 |
| $e_{16!}{}^i$ | 15 | 6 | 3 | 2 | 1 | 1 |
| $b_{16}{}^i$ | 4 | 4 | 3 | 2 | 2 | 2 |

There now follows a brief description of the memory capacities required to store the basic decompositions.

Independently of the solution chosen for the representation of the basic decompositions, the basic decompositions are stored in tables and use can then be made of an addressing of these tables in rank encoding and decoding operations. Although the decomposition of 0 is not possible (and, moreover, not used), it may be preferable to store "dummy" exponents for the decomposition of 0 (for example 0s or 1s), to simplify the address calculation. Table 8 below summarizes the memory size needed to store the data relating to the basic decompositions for the five solutions described for these two cases (storage or non-storage of the dummy decomposition of 0).

TABLE 8

Memory needed to store the basic decompositions

| Solution | No storage of 0 | With dummy storage of 0 |
|---|---|---|
| 1 | $\sum_{l=1}^{n} m_l + \sum_{l=0}^{n} m_{l!} + 2n + 1$ | $\sum_{l=0}^{n} m_l + \sum_{l=0}^{n} m_{l!} + 2(n+1)$ |
| 2 | $2\sum_{l=1}^{n} m_{l!} + 1 + (n+1)$ | $2\sum_{l=0}^{n} m_{l!} + (n+1)$ |
| 3 | $\sum_{l=0}^{n} m_{l!} + 2\sum_{l=1}^{n} m'_l + 2n + 1$ | $\sum_{l=0}^{n} m_{l!} + 2\sum_{l=0}^{n} m'_l + 2(n+1)$ |
| 4 | $m_{n!} \times (2n+1)$ | $2m_{n!} \times (n+1)$ |
| 5 | $2n + 1 + m_{n!}$ | $2 \times (n+1) + m_{n!}$ |

In the fifth solution, the storage ($+m_{n!}$) of the numbers of bits $b_n{}^i$ is taken into account. However, in practice, rather than read them from a memory, the latter are "hardwired" (their value being set in a calculation program without being declared as variable), as will be seen in the embodiments below. It therefore appeared pointless to store them in practice.

Table 9 gives the memory needed to store the data relating to the exponents of the decomposition of these five solutions for $n_{max}=8$ and 15 (with dummy storage of 0).

TABLE 9

Memory required to store the basic decompositions for the permutation codes of dimensions 8 and 15

| n | $\sum_{l=0}^{n}(m_{l!}+m_l) + 2(n+1)$ | $\sum_{l=0}^{n} m_{l!} + (n+1)$ | $\sum_{l=0}^{n} m_{l!} + \sum_{l=0}^{n} 2m'_l + 2(n+1)$ | $2m_{n!} \times (n+1)$ | $2 \times (n+1) + m_{n!}$ |
|---|---|---|---|---|---|
| 8 | 54 | 51 | 57 | 72 | 22 |
| 15 | 129 | 130 | 129 | 192 | 38 |

There now follows a description of the storage of the prime factor powers.

Outside the basic decompositions, the present invention uses the prime factor powers to calculate the partial rank from its decomposition. It is possible, from a table of these prime factors, to calculate their powers in real time ("on line"). Preferably, the powers of the prime numbers other than 2 are precalculated and stored and only the powers of 2 are calculated in real time. The table 10a below gives the powers of 3, 5 and 7 needed for a permutation code of dimension 8 (like those used in the AMR-WB+ encoder). Table 10b gives the powers of 3, 5, 7, 11 and 13 needed for the permutation codes of maximum dimension 15 (like those used in the TDAC encoder).

TABLE 10a

Prime factor powers for the permutation codes of dimension 8

| | $e^i$ | | | |
|---|---|---|---|---|
| $p_i$ | 0 | 1 | 2 | 3 |
| 3 | 1 | 3 | 9 | 27 |
| 5 | 1 | 5 | 25 | — |
| 7 | 1 | 7 | 49 | — |

TABLE 10b

Prime factor powers for the permutation codes of dimension 15. The variable Npfp here designates the number of prime factor powers to be stored.

| | $p_i$ | | | | | | | | |
|---|---|---|---|---|---|---|---|---|---|
| $e_i$ | 0 | 1 | 2 | 3 | 4 | 5 | 6 | 7 | Npfp |
| 3 | 1 | 3 | 9 | 27 | 81 | 243 | 729 | 2187 | 8 |
| 5 | 1 | 5 | 25 | 125 | — | — | — | — | 4 |
| 7 | 1 | 7 | 49 | 343 | — | — | — | — | 4 |
| 11 | 1 | 11 | 121 | — | — | — | — | — | 3 |
| 13 | 1 | 13 | 169 | — | — | — | — | — | 3 |

Here again, it is possible to store only the necessary number of powers for each prime factor. As a variant, if it is preferred to have only a single table of regularly addressable powers, provision can be made to store, for each prime factor, as many values as the number of powers of $p_2$ that are needed ($p_2$=3). For the unused powers, it is, of course, possible to use a storage of dummy values such as 1s or 0s.

There now follows a description of the calculation of the rank of a permutation to perform an encoding using the invention.

There are several variants depending on the set of basic decompositions selected and their representation. For conciseness, the explanation of the possible implementations below is limited to the case of the preferred embodiment for the set of basic decompositions, with decompositions of the factorials of l! and l.

Below, the solution of exploded representation of the exponents with $m_{n!}$ exponents for each basic decomposition, which is the most general case, is explained first. Variants of exploded representation of the exponents are then described. Finally, the solution of compact representation of the exponents of the basic decompositions is explained, together with a few of its variants. It will then become apparent that the invention is perfectly applicable to a processing operation for encoding the rank of a permutation.

The Schalkwijk algorithm is reviewed below, as an example of enumeration processing.

Exploded Representation of the Exponents of the Decomposition

Let n be the maximum dimension of the permutation codes used, and $m_{n!}$ be the number of prime factors involved in the decomposition of the quantity n!.

A description of a first embodiment of an encoding that uses an exploded representation of the exponents of the decomposition is given below.

Encoding According to a First Embodiment

Here, the exponents of the basic decompositions of l and l! are preferably stored according to the "fourth" solution of table 4d hereinabove, with dummy storage for l=0 in two single-dimensional tables respectively denoted $D_l$ and $D_{l!}$ having $m_{n!} \times (n+1)$ cells. As mentioned hereinabove, it would also be possible to consider two-dimensional tables having $m_{n!}$ columns and (n+1) rows. The exponents of l (respectively l!) being stored regularly (each on $m_{n!}$ values), the operations for reading the exponents of a basic decomposition necessitate an address calculation in the table $D_l$ (respectively $D_{l!}$). To read the exponents of the decomposition of l! (respectively l), it is necessary to point to the address ($l \times m_{n!}$) of the table $D_{l!}$ (respectively $D_l$), and so target the address of the exponent $e_{l!}^1$ (respectively $e_l^1$), the exponent $e_{l!}^2$ (respectively $e_l^2$) being at the next address ($l \times m_{n!} + 1$) and more generally the exponent $e_{l!}^i$ (respectively $e_l^i$) being at the address ($l \times m_{n!} + i - 1$). As mentioned hereinabove, in two-dimensional tables, the exponent $e_{l!}^i$ (or $e_l^i$) is at the address ((l; (i−1)) (column (i−1) and row l).

It should be noted that, if provision is not made for dummy storage for l=0, the address calculation in the table $D_l$ of the n basic decompositions of l (l>0) is: $(l-1) \times m_{n!}$.

Initialization

The $m_{n!}$ exponents of the intermediate decomposition of $P_k$ (stored in a table P having $m_{n!}$ cells which is preferably updated in each position, as will be seen with reference to the step C-3 below) are initialized at zero. Thus, the instructions are as follows:

P[i]=0, $1 \leq i \leq m_{n!}$

The rank t and the q weights $w_k^d$ (stored in a table w having q cells which will be updated in each position (step C-2 hereinbelow)) are also initialized at zero. The instructions are as follows:

t=0 w[i]=0, $0 \leq i < q$ k=n−1

Iterations on the Index k

Reference is made to FIG. 5 to follow the iteration on the n positions (with a loop on the variable k). The letter "C" in the notations of the steps C-n of FIG. 5 designates the word "coding".

In the step C-1, the variable $d_k$ is read. The step C-2 consists of an update of the cell $d_k$ of the table w: $w[d_k] = w[d_k] + 1$.

The step C-3 is an update of the exponents of the decomposition of $P_k$ (table P), with, in particular:

a reading of the $m_{n!}$ exponents $e_{w[d_k]}^i$ of the basic decomposition $w[d_k]$ in the table $D_l$ from the address $m_{n!} \times w[d_k]$ (step C-31), and an update: $P[i] = P[i] + e_{w[d_k]}^i$, for $1 \leq i \leq m_{n!}$ (step C-32).

Thus, to implement the step C-31, the first exponent of the basic decomposition $w[d_k]$ in the table $D_l$, denoted $e_{w[d_k]}^1$, is at the address $m_{n!} \times w[d_k]$, the second, denoted $e_{w[d_k]}^2$, at the address ($m_{n!} \times w[d_k] + 1$), and so on. More generally, the exponent $e_{w[d_k]}^i$ will be at the address $m_{n!} \times w[d_k] + i - 1$.

In parallel, in the step C-4, $S_k$ is calculated from the usual relation $$S_k = \sum_{d=0}^{d_k-1} w[d]$$

The step C-5 is a test on the value of $S_k$. If $S_k$ is zero (Y arrow), which means that the partial rank $I_k^{d_k}$ is zero (formula (7) hereinabove) and that the rank t is unchanged, the processing continues with the step C-11 later. Otherwise (N arrow with $S_k \neq 0$), the processing continues with the step C-6, in which the $m_{n!}$ exponents $e_{S_k}^i$ of the basic decomposition $S_k$ are read in the table $D_l$ at the address $m_{n!} \times S_k$.

In parallel, the step C-7 consists in reading the $m_{n!}$ exponents $e_{(n-1-k)!}^i$ of the basic decomposition $(n-1-k)!$ in the table $D_{l!}$ at the address $m_{n!} \times (n-1-k)$. It will be noted that the step C-7 is performed if the sum $S_k$ is not zero (N output of the test C-5) so as to avoid the unnecessary reading in the table $D_{l!}$ if, in any case, the partial rank $I_k^{d_k}$ is zero.

In the step C-8, the results of the different readings of the tables can be grouped together to calculate first of all the $m_{n!}$ exponents of the decomposition of the partial rank $I_k^{d_k}$, according to the relation:

$$e_{I_k^{d_k}}^i = e_{(n-1-k)!}^i + e_{S_k}^i - P[i], \text{ for } 1 \leq i \leq m_{n!}$$

Finally, in the step C-9, the partial rank $I_k^{d_k}$ is itself calculated by the relation:

$$I_k^{d_k} = \prod_{i=1}^{m_{n!}} (p_i)^{e_{I_k^{d_k}}^i}$$

It will be recalled that the term $w[d_k]$ is a weight that is necessarily less than or equal to the maximum dimension n of the permutation code concerned. Similarly, the sum $S_k$ of such weights remains less than the maximum dimension n and the same applies, of course, for $(n-1-k)$. The decompositions of $w[d_k]$, $S_k$ and $(n-1-k)!$ are indeed listed in the tables of decompositions of the integers or of the integer factorials ranging up to the maximum dimension n, such as the table 4d. From the decomposition $w[d_k]$ listed in a table and the decomposition of $P_{k-1}$ determined on the preceding loop $(k-1)$ and kept in memory, the decomposition of $P_k$ is determined.

As a purely illustrative example of the partial rank calculation steps of FIG. 5, a permutation code of dimension n=8 and q=4 is considered. In this example, the exponents are stored in a two-dimensional table with four columns and nine rows, therefore comprising 36 cells. It can therefore be extracted from the table 4d given hereinabove in which $p_i$=2, 3, 5, 7 in columns and l=0, ..., 8 in rows.

In this example, it is assumed that, at a preceding position k=3, the table of the weights w is {1, 1, 0, 3} and therefore $P_3$=1! 1! 0! 3!=6. The table P of the exponents of the decomposition of $P_3$ (=$2^1 \times 3^1 \times 5^0 \times 7^0$) is therefore {1, 1, 0, 0}.

In the position k=2, for the step C-1, it is assumed that $d_2$=2 has been read. In this example, in the step C-2, the cell w[2] is updated by incrementing it by 1 (w[2]=0+1=1).

In the step C-31, the four exponents of the decomposition of 1 (=w[2]) are read, namely 0, 0, 0, 0 (see table 4d, 6th to 9th columns and 3rd row l=1).

Then (step C-32), the table P is updated, so P={1, 1, 0, 0} is obtained.

In the step C-4, $S_k$ is calculated: $S_k$=w[0]+w[1]=1+1=2. $S_k$ is therefore not zero (test C-5).

The four exponents of the decomposition of $S_k$ are read (step C-6) (still referring to table 4d, 6th to 9th columns but 4th row l=2): for $p_i$=2 (6th column), the exponent is 1, and, for $p_i$=3, 5, 7 (7th to 9th columns), the exponent is zero.

The four exponents of the decomposition of 5! (corresponding to (n−1−k)!) are read (step C-7), still referring to table 4d, but this time in the 2nd to 5th columns and 7th row l=5. For $p_i$=2 (2nd column), the exponent is 3. For $p_2$=3 (3rd column), the exponent is 1 and for $p_3$=5 (4th column), the exponent is also 1. On the other hand, for $p_4$=7 (5th column), the exponent is zero.

In the step C-8, the four exponents of the decomposition of the partial rank $I_k^{d_k}$ are calculated:

for $p_1 = 2$, $e_{I_k^{d_k}}^1 = e_{(n-1-k)!}^1 + e_{S_k}^1 - P[1] = 3 + 1 - 1 = 3$ for $p_2 = 3$, $e_{I_k^{d_k}}^2 = e_{(n-1-k)!}^2 + e_{S_k}^2 - P[2] = 1 + 0 - 1 = 0$ for $p_3 = 5$, $e_{I_k^{d_k}}^3 = e_{(n-1-k)!}^3 + e_{S_k}^3 - P[3] = 1 + 0 - 0 = 1$ for $p_4 = 7$, $e_{I_k^{d_k}}^4 = e_{(n-1-k)!}^4 + e_{S_k}^4 - P[4] = 0 + 0 - 0 = 0$ In the step C-9, the partial rank $I_k^{d_k}$ is calculated from the exponents of its decomposition: $2^3 \times 3^0 \times 5^1 \times 7^0 = 40$.

Referring again to FIG. 5, the global rank t of the permutation is itself determined by updating (with addition of the partial rank $I_k^{d_k}$ found in the step C-9) according to the relation $t = t + I_k^{d_k}$, in the step C-10.

The step C-11 then aims to decrement the variable k (k=k−1) and the step C-12 is a test on the value of k to decide whether to continue the processing. Thus, if k≧0 (Y arrow at the output of the test C-12), the steps of the processing operation are reiterated from the first step C-1, with a value of k decremented by one unit. Otherwise (N arrow at the output of the test C-12), the processing is terminated in the end step C-13 ("END").

Thus, it will be understood that the above step C-9 calculates a partial rank from its decomposition determined in the step C-8, itself determined from three intermediate decompositions:

(n−1−k)!

$S_k$, and $P_k$.

The determination of two of them, (n−1−k)! and $S_k$, performed in the steps C-6 and C-7, involves a simple read in the respective tables of the basic decompositions $D_l$ and $D_{l!}$. The determination of the third intermediate decomposition (that of $P_k$) can also be performed simply from the q basic decompositions of w[d]! read in the table $D_{l!}$ according to a relation of the type $$P[i] = \sum_{d=0}^{q-1} e_{w[d]!}^i, 1 \leq i \leq w_{m!}.$$

Direct Variants

The step C-3 presents a more advantageous variant of determination of this intermediate decomposition. The intermediate decomposition of $P_k$ can in effect be determined from a basic decomposition read in the table $D_l$ and from another intermediate decomposition (that of $P_{k+1}$) calculated for another partial rank ($I_{k+1}^{d_k}$), for example the preceding partial rank $I_{k+1}^{d_k}$ in the iteration of k. More generally, in a variant of the invention, an intermediate decomposition can also be deduced from at least one intermediate decomposition previously determined for at least one other partial rank.

Hereinabove, the calculation of the rank was performed by a loop from the last position (k=n−1) to the first position (k=0). However, the invention also applies, of course, to a loop from the first to the last position. All that is needed is to change the initialization phase and adapt the steps C-2 and C-3 and their order. To this end, the table of the weights w can be initialized with the q weights $w_0^d$. Then, for d ranging from 0 to q−1, the $m_{n!}$ exponents of the decomposition of w[d]! are read in the table $D_{l!}$, to calculate by cumulative addition, the $m_{n!}$ values of the table of the intermediate decomposition (exponents of the decomposition of $P_0$).

The step C-3 then takes place after the step C-10 and before the step C-2. The intermediate decomposition of P is updated by subtracting from P[i] the exponent $e_{w[d_k]}^i$ of the basic decomposition of $w[d_k]$ ($P[i]=P[i]-e_{w[d_k]}^i$, for $1 \leq i \leq m_{n!}$). Then, the step C-2 can be conducted by decrementing by 1 the value of $w[d_k]$ ($w[d_k]=w[d_k]-1$). The step C-11 can target the incrementation of the variable k by 1 and the step C-12 simply tests whether k=n.

It is worth briefly noting that, for the permutation codes of variable dimension n, rather than performing $m_{n_{max}!}$ operations, it may be preferable to read $m_{n!}$ on initialization to perform the operations only $m_{n!}$ times.

General Variants of the First Embodiment

More generally, the implementation represented in FIG. 5 for an encoding in the sense of the invention allows numerous variants.

Thus, in a first variant, each basic decomposition (of l or l!) also contains the number $m_{l!}$. The reading of the number $m_{l!}$ ($0 \leq l \leq n$) offers advantages. In effect, the steps C-3 and C-6 to C-10 are no longer carried out $m_{n!}$ times each, but only:

$m_{w[d_k]!}$ times for the step C-3, $m_{S_k!}$ times for the step C-6 and for the addition $e_{(n-1-k)!}^i + e_{S_k}^i$ of the step C-8, and $m_{(n-1-k)!}$ times for the steps C-7 and C-9 and for the subtraction $$e_{I_k^{d_k}}^i = e_{(n-1-k)!}^i + e_{S_k}^i - P[i]$$

of the step C-8.

If, furthermore, the values $m_l$ have been stored, all that is then needed is to perform:

the step C-3 $m_{w[d_k]}$ times, and the step C-6 $m_{S_k}$ times and the addition of the step C-8.

In another variant of the encoding, if in addition, the storage of the exponents of the basic decomposition of/is used according to the third solution (table 4c hereinabove), the step C-3 can be performed for $m_{w[d_k]}$ values. Similarly, the step C-6 is performed for $m'_{S_k}$ values. In the step C-8, instead of providing $m_{(n-1-k)!}$ additions and $m_{(n-1-k)!}$ subtractions, the number of subtractions to be is performed remains $m_{(n-1-k)!}$ but only $m'_{S_k}$ additions are needed. In particular:

$$e_{I_k^{d_k}}^i = e_{(n-1-k)!}^i - e_{P_k}^i, \quad \text{for } 1 \leq i \leq m_{(n-1-k)!}$$

and $$e_{I_k^{d_k}}^{i(j)} = e_{d_k}^{i(j)} + e_{S_k}^{i(j)}, \quad \text{for } 1 \leq j \leq m'_{S_k}$$

In a third variant, instead of decomposing a partial rank into three terms (two in the numerator and one in the denominator), it is decomposed into two terms, one of which is a quotient. Thus, the partial rank $I_k^{d_k}$ is decomposed into two terms:

the sum $S_k$ and a quotient $$R_k = \frac{(n-1-k)!}{\prod_{i=0}^{q-1}(w_k^i!)}.$$

This quotient can be updated by the following relation:

$$R_k = \frac{(n-1-k)!}{\prod_{i=0}^{q-1}(w_k^i!)}$$

$$= \frac{(n-1-(k+1))! \times (n-1-k)}{\prod_{i=0}^{q-1}(w_{k+1}^i!) \times w_k^{d_k}}$$

$$= R_{k+1} \times \frac{(n-1-k)}{w_k^{d_k}}$$

Thus, rather than determine the decomposition of $R_k$ from the q+1 basic decompositions (those of (n−1−k)! and of the q $w[d_k]$! read in the table $D_{l!}$), an intermediate decomposition of $R_k$ is determined from the intermediate decomposition of $R_{k+1}$ and from the basic decompositions of (n−1−k) and of $w[d_k]$ (these two basic decompositions being read in the table $D_l$), which is expressed:

$$e_{R_k}^i = e_{R_{k+1}}^i + e_{n-1-k}^i - e_{w_k^{d_k}}^i$$

Compared to the preceding variants, instead of determining and storing the intermediate decomposition of the denominator of $I_k^{d_k}$ (table P), the intermediate decomposition of the quotient $R_k$ is determined then stored (providing for this purpose a table R). The initialization at zero of the table P is replaced by that of the table R of the exponents of this ratio. The step C-3 becomes a simple step for updating the table R (with a reading of the exponents of the basic decompositions of (n−1−k) and $w[d_k]$), which is expressed:

$$R[i] = R[i] + e_{n-1-k}^i - e_{w_k^{d_k}}^i$$

According to the storage option, this update can be done with $m_{n!}$ additions and subtractions or $m_{(n-1-k)!}$ additions (respectively $m_{w[d_k]!}$ subtractions), or even $m_{(n-1-k)}$ additions (respectively $m_{w[d_k]}$ subtractions), or only for the non-zero exponents of w[$d_k$] and (n−1−k): $m'_{(n-1-k)}$ additions and $m'_{w[d_k]}$ subtractions. The step C-8 then only comprises additions of the type:

$$e^i_{I^{d_k}_k} = R[i] + e^i_{S_k}$$

According to the storage option, $m_{n!}$ additions or $m_{S_k!}$ additions, or even $m_{S_k}$ additions, or, only for the non-zero exponents of $S_k$: $m'_{S_k}$ additions are then counted.

It will be noted that this ratio $R_k$ is not necessarily an integer, which means that the exponents R[i] can be negative. In this variant, the decomposition of the factorials in the encoding (therefore table $D_{l!}$) is no longer useful, such that a simple set of (n+1) basic decompositions of the integers 1 (1≦n) can be used by storing only the table $D_l$.

Compact Representation of the Exponents of the Decomposition

There now follows a description of a second embodiment of an encoding, based on a compact representation of the exponents of the decomposition.

The exponents of the basic decompositions are represented compactly and no longer in exploded form as described hereinabove with reference to the first embodiment. For conciseness, only the case where the compact representation of the exponents is contained in a single word is explained. These words are therefore stored as described hereinabove, with storage of a dummy word for l=0 in the two tables respectively denoted $D'_l$ and $D'_{l!}$ with (n+1) cells. The calculation of the address in these two tables of a word containing the exponents of a basic decomposition is direct because, to read the word of the decomposition of l! (respectively l), all that is needed is to point to the address l of the table $D'_{l!}$ (respectively $D'_l$).

It will be noted that, without the storage of a dummy word for l=0, the word corresponding to a basic decomposition l (with l>0) is at the address (l−1) in table $D'_l$.

Encoding According to a Second Embodiment

Initialization

The word $e_P$ containing the compact representation of the $m_{n!}$, exponents of the intermediate decomposition of $P_k$ is initialized at zero: $e_P=0$ The word $e_P$ will be updated in each position (step CC-3 below).

As previously, the rank t and the q weights $w^d_k$ stored in a table w having q cells which will be updated in each position (step CC-2 hereinbelow) are also initialized at the value zero. The corresponding instructions are:
t=0
w[i]=0, 0≦i<q
k=n−1

Iteration on the n Positions (Loop on k)

Reference is now made to FIG. 6 to follow the main steps of the encoding in this second embodiment. The letters "CC" in the notations of the steps CC-n of FIG. 6 designate "encoding" with a "compact representation".

In the step CC-1, the variable $d_k$ is read. The step CC-2 consists of an update of the variable w: w[$d_k$]=w[$d_k$]+1.

The step CC-3 is an update of the word $e_p$ with, in particular:
in the step CC-31, the reading of the word $e_{w[d_k]}$ containing the compact representation of the exponents of the decomposition of w[$d_k$] in the table $D'_l$ then,
in the step CC-32, the update proper of the word $e_p=e_p+e_{w[d_k]}$ In parallel, in the step CC-4, the sum $S_k$ is calculated:

$$S_k = \sum_{d=0}^{d_k-1} w[d].$$

The following step CC-5 is a test on the value of $S_k$. If the sum $S_k$ is zero (N arrow), the index k is directly decremented. Otherwise (Y arrow at the output of the test CC-5), the processing continues with a reading of the word $e_{S_k}$ containing the compact representation of the exponents of the decomposition of $S_k$ in the table $D'_l$ in the step CC-6.

In parallel (and advantageously depending on the result of the test CC-5), the word $e_{(n-1-k)!}$ containing the compact representation of the exponents of (n−1−k)! is read in the table $D'_{l!}$, in the step CC-7.

In the step CC-8, the results obtained from the various steps CC-3, CC-6, CC-7 are grouped together to calculate the word $$e_{I^{d_k}_k}$$

containing the compact representation of the decomposition of the partial rank $I_k^{d_k}$, by two simple operations (preferably an addition followed by a subtraction):

$$e_{I^{d_k}_k} = e_{(n-1-k)!} + e_{S_k} \text{ then } e_{I^{d_k}_k} = e_{I^{d_k}_k} - e_P$$

The step CC-9 targets the extraction of the $m_{n!}$ exponents $$e^i_{I^{d_k}_k}$$

of the decomposition of the partial rank $I_k^{d_k}$ and contained in the word $$e_{I^{d_k}_k},$$

by appropriate offset of the bits of the word as described previously. To this end, a loop is provided on an index i ranging from 1 to $m_{n!}$ (initialization CC-91 of i at 1, test CC-93 on the value of i and incrementation CC-94 until i reaches the value of $m_{n!}$). Each loop of i then has applied to it instructions CC-92 of the type:

$$e^i_{I^{d_k}_k} = e_{I^{d_k}_k} \,\&\, ((1 << b^i_n) - 1) \qquad i'1)$$

$$e_{I^{d_k}_k} = e_{I^{d_k}_k} >> b^i_n \qquad i'2)$$

It will be recalled that the notations "<<b" and ">>b" respectively designate a left shift and a right shift of b bits. Moreover, the notation "&" designates the bit-by-bit "AND" logic operator. The instruction i'1) consists in recovering the $b^i_n$ low order bits of $e^i_{I^{d_k}_k}.$ In practice, the masks corresponding to the instruction "$((1<<b_n^1)-1)$" are hardwired.

In other words, a mask $((1<<b_n^i)-1)$ of the high order bits is applied at the outset (for the loop index i equal to 1) so as first of all to recover only the $b_n^1$ low order bits of $e_{I^{d_k}_k}$ giving the exponent $e^1_{I^{d_k}_k}$ associated with the first prime factor $p_1$.
Then:
the bits of $e_{I^{d_k}_k}$ are shifted by $b_n^1$ "to the right" to recover the highest order bits giving the exponents associated with the next prime factor $p_2$ (mask $((1<<b_n^2)-1)$ of the high order bits, the exponent $e^2_{I^{d_k}_k}$ is then extracted,
then, a right shift of $b_n^2$ bits is applied,
and so on until $i=m_{n!}$.

The following step CC-10 consists in calculating the partial rank $I^{d_k}_k$ as follows:

$$I^{d_k}_k = \prod_{i=1}^{m_{n!}} (p_i)^{e^i_{I^{d_k}_k}}$$

Then, the partial rank $I^{d_k}_k$ is added to the total rank t (t=t+ $I^{d_k}_k$ in the step CC-11).

The value of the index k is decremented in the next step CC-12 (k=k−1) and, before recommencing the steps CC-4, CC-1, CC-7 and subsequent steps with this decremented value, a check is carried out in the test CC-13 to see if the value of k has not reached −1 (k<0), in which case the processing is terminated (step CC-14).

Thus, independently of the representation of the decompositions, the present invention makes it possible to effectively calculate partial ranks. The step CC-10 targets the calculation of a partial rank from its decomposition determined in the preceding steps CC-8 and CC-9. Three intermediate decompositions (of the terms (n−1−k)!, $S_k$ and $P_k$) are used. The determination of two of them ((n−1−k)! and $S_k$) performed in the steps CC-6 and CC-7 consists in a simple reading of their compact representation in the tables $D'_{l!}$ and $D'_l$. The determination of the third intermediate decomposition ($P_k$) performed in the step CC-3 also requires a reading of the table $D'_l$ followed by an update of the compact representation of this intermediate decomposition by addition of the compact representation of the basic decomposition which has been read.

As indicated previously with reference to the first embodiment, the storage of the values $m_{l!}$ (0≦l≦n) makes it possible to reduce the complexity of the steps CC-9 and CC-10. The loop for extraction of the exponents of the decomposition of a partial rank $I^{d_k}_k$ is performed $m_{(n−1−k)!}$ times instead of $m_{n!}$ times. Similarly, the step CC-10 no longer comprises $m_{n!}$ multiplications, but $m_{(n−1−k)!}$ multiplications.

There now follows a description of the decoding of the rank of a permutation by using the invention.

Here again, there are several variants depending on the solution for representation of the basic decompositions (exploded or compact). There follows a description of a first embodiment of the decoding, similar to the first embodiment described hereinabove for the encoding using the exploded representation of the decompositions and their storage according to the fourth solution relating to table 4d given above. It will become apparent that the invention is perfectly applicable to a decoding of the rank of a permutation taking the Schalkwijk algorithm as the example.

Decoding According to the First Embodiment

The decoding using an exploded representation of the exponents of the decomposition preferably begins with an initialization of the data as follows.

Initialization

The table of the values w is initialized with the q weights $w_0^d$ (w is updated at end of loop on each position of the step D-19 which will be described below). An appropriate instruction can be of the type:
w[i]=$w_0^i$, 0≦i<q The $m_{n!}$ exponents of the decomposition of the term $P_0$ are calculated (stored in a table P having $m_{n!}$ cells also updated in each position at end of loop on each position in the step D-18 described below). The appropriate instructions can be of the type:
P[i]=0 for 1≦i≦$m_{n!}$
Loop from d=0 to q−1
reading of the $m_{n!}$ exponents $e_{w_0^d!}^i$ of the decomposition of $w_0^d!$ in the table $D_{l!}$
then P[i]=P[i]+$e_{w_0^d!}^i$, with 1≦i≦$m_{n!}$ Finally, k=0 is initialized Reference is now made to FIG. 7 to follow the main steps of the decoding according to the first embodiment. The letter "D" in the notations of the steps D-n in FIG. 7 stands for "decoding".

Iteration on the n Positions (Loop on the Index k)

The first step D-1 consists in a reading of the $m_{n!}$ exponents $e_{(n−1−k)!}^i$ of the decomposition of (n−1−k)! in the table $D_{l!}$ The next step D-2 sets the values $d_k$=0 and $I^{d_k}_k$=0.

There then follows a search for the first value of $d_k$ of the alphabet such that w[$d_k$]≠0. For this purpose, a test D-3 is provided to check whether w[$d_k$]=0, in which case (Y arrow) the value of $d_k$ is incremented ($d_k$=$d_k$+1) and the test D-3 is reiterated until a non-zero w[$d_k$] value is found. If this value has been found (N arrow for w[$d_k$]≠0), the next step is a test D-5 on the value of the rank t. If the rank is zero (Y arrow at the output of the test D-5), applying the following steps is pointless until the exponents of $P_k$ are updated (step D-18). If the rank is not zero (N arrow at the output of the test D-5), the processing continues with the subsequent steps D-6 and D-7 in which there are respectively set $S_k$=0 and an intermediate value $I_k$ at $I_k$=$I^{d_k}_k$.

The next step D-8 is a calculation for updating the sum $S_k=S_k+w[d_k]$. It is followed by the reading of the table $D_l$ (step D-9) of the $m_{n!}$ exponents $e_{S_k}^i$ of the decomposition of the sum that is found $S_k$.

The step D-10 targets the calculation of the $m_{n!}$ exponents $$e^i_{I_k^{d_k}}$$

of the decomposition of the partial rank, from the relation:

$$e^i_{I_k^{d_k}} = e^i_{(n-1-k)!} + e^i_{S_k} - P[i],$$

with $1 \leq i \leq m_{n!}$. The exponents $P[i]$, initialized as described above, are updated in the step D-18 which will be described later, at the end of the current loop and for a next loop.

The step D-11 targets the calculation of the partial rank:

$$I_k^{d_k} = \prod_{i=1}^{m_{n!}} (p_i)^{e^i_{I_k^{d_k}}}$$

The next three steps target a test on the value of the total rank t, by comparing it to the value of the partial rank. To do this, in the step D-12, the value of $d_k$ is incremented ($d_k=d_k+1$) and the test D-13 is as follows: $t-I_k^{d_k} \geq 0$?

If the inequality is satisfied (Y arrow), the steps D-7 to D-13 are repeated with the new incremented value of $d_k$. Otherwise (N arrow), the processing continues with the step D-14 for decrementing the value of $d_k$ ($d_k=d_k-1$) to return to the value of $d_k$ before the step D-12. For this value of $d_k$, the partial rank $I_k^{d_k}$ takes the abovementioned intermediate value $I_k$ (step D-15: $I_k^{d_k}=I_k$). Then, the rank t is updated, becoming $t=t-I_k^{d_k}$ (step D-16), and the exponents of $P_k$ are updated (in the table P) from the reading of the $m_{n!}$ exponents $e_{w[d_k]}^i$ of the decomposition of $w[d_k]$ in the table $D_l$ (step D-17), followed by the updating proper of the exponents $P[i]=P[i]-e_{w[d_k]}^i$ for $1 \leq i \leq m_{n!}$ (step D-18). The value of $w[d_k]$ is then decremented ($w[d_k]=w[d_k]-1$: step D-19) and that of the index k is incremented (k=k+1: step D-20) to prepare the next loop.

Before looping back to the first step D-1, a check is carried out to ensure that the n components have not all been processed. For this, the test D-21 on the value of k is provided, by comparing it to n (k<n). As long as the index k has not reached the value n (Y arrow at the output of the test D-21), the processing is recommenced at the step D-1 for a next value of k. Otherwise (N arrow at the output of the test D-21), the processing is terminated at the end step D-22.

It should be remembered that the step D-11 targets the calculation of a partial rank by using its decomposition determined in the step D-10 from three intermediate decompositions of the respective terms $(n-1-k)!$, $S_k$ and $P_k$. The determinations of two of them ($(n-1-k)!$ and $S_k$) performed in the steps D-1 and D-9 consist of a simple reading in the respective tables $D_{l!}$ and $D_l$. The determination of the third intermediate decomposition ($P_k$)) performed in the step D-18 is also performed by a reading of the table $D_l$ (step D-17) followed by an update by exponents of this intermediate decomposition by subtraction of the exponents of the basic decomposition that has been read (step D-18). The initialization described hereinabove of this intermediate decomposition requires q readings of the table $D_{l!}$ followed by an update by exponents of this intermediate decomposition by addition of the exponents of the q basic decompositions read.

As for the encoding described hereinabove, the processing of FIG. 7 allows for variants which can, where appropriate, reduce the complexity of certain steps.

A variant involving the use of the exponents of the ratio $R_k$ (as described previously) is particularly interesting. In effect, in the decoding processing operation described hereinabove with reference to FIG. 7, for a given position k, the exponents $$e^i_{I_k^{d_k}}$$

are calculated for several values of d. For each value of d tested, the other variants require, for each exponent, a subtraction and an addition $$\left(e^i_{I_k^{d_k}} = e^i_{(n-1-k)!} - e^i_{P_k} + e^i_{S_k}\right).$$

However, the variant using the exponents of the ratio $R_k$ requires only an addition $$\left(e^i_{I_k^{d_k}} = R[i] + e^i_{S_k}\right)$$

because only the sum $S_k$ and its exponents $e_{S_k}^i$ vary according to d for a given position k.

Decoding According to a Second Embodiment

There now follows a description, with reference to FIG. 8, of an example of implementation of a decoding using the compact representation of the decompositions.

First, the data is initialized as follows.

Initialization

Reference should first be made to the table w having q cells to determine the terms $w[i]=w_0^i$ for $0 \leq i < q$.

The word $e_P$ is calculated, containing the compact representation of the $m_{n!}$ exponents of the decomposition of $P_k$. For this:

$e_P=0$ is set and a loop is provided for d=0 to q-1:

with reading of the word $e_{w_0^d!}$ containing the compact representation of the $m_{n!}$ exponents of $w_0^d!$ in the table $D'_{l!}$ and updating of $e_P=e_P+e_{w_0^d!}$ k=0 is then set Iteration on the n Positions (Loop on k)

The letters "DC" in the notations of the steps DC-n of FIG. 8 designate "decoding" with a "compact representation".

The step DC-1 consists in reading the word $e_{(n-1-k)!}$ containing the compact representation of the $m_{n!}$ exponents of the term $(n-1-k)!$ in the table $D'_{l!}$ The steps DC-2 to DC-8 are similar to the steps D-2 to D-8 described hereinabove with reference to FIG. 7.

On the other hand, in the step DC-9, the word $e_{S_k}$ is read, containing the compact representation of the $m_{n!}$ exponents of the sum $S_k$ in the table $D'_l$. Then, in the step DC-10, the word containing the compact representation of the exponents of the partial rank $I_k^{d_k}$ is calculated, preferably as follows:

$$e_{I_k^{d_k}} = e_{(n-1-k)!} + e_{S_k} \text{ then } e_{I_k^{d_k}} = e_{I_k^{d_k}} - e_P$$

The general step DC-11 globally consists in an extraction of the exponents of the partial rank $I_k^{d_k}$. To this end, provision is made for:
 a loop on i ($1 \leq i \leq m_{j!}$) (initialization of i=1 in the step DC-111 and after the extraction of the exponent $$e_{I_k^{d_k}}^i$$

described hereinbelow (step DC-112), comparison (test DC-113) of the loop index i with the value $m_{n!}$, with incrementation of the index i (step DC-114) until the value $m_{n!}$ has been reached);
 extraction of the exponent $$e_{I_k^{d_k}}^i.$$

(step DC-112):
 represented in the low order bits of the compact exponent $$e_{I_k^{d_k}}$$

by masking of the high order bits of $$e_{I_k^{d_k}}$$

by the mask $((1<<b_n^i)-1)$:

$$e_{I_k^{d_k}}^i = e_{I_k^{d_k}} \& ((1<<b_n^i)-1)$$

this masking being followed by a right shift of $b_n^i$ bits of the compact exponent $$e_{I_k^{d_k}}:$$

$$e_{I_k^{d_k}} = e_{I_k^{d_k}} >> b_n^i$$

This general step DC-11 is similar to the general step CC-9 in FIG. 6 for the encoding.

The steps DC-12 to DC-17 are, themselves similar to the steps D-11 to D-16 described hereinabove with reference to FIG. 7 specific to the decoding in exploded representation.

The updating of the exponents of $P_k$ (table P) in the general step DC-18 is done, on the other hand, in the step DC-181, by reading the word $e_{w[d_k]}$ containing the compact representation of the $m_{n!}$ exponents of $w[d_k]$ in the table and the updating proper of the exponents of $P_k$ ($e_P = e_P - e_{w[d_k]}$) is then performed in the step DC-182.

Then, the steps DC-19 to DC-22 are similar to the steps D-19 to D-22 in FIG. 7 specific to the decoding using an exploded decomposition.

There now follows a description of the various advantages offered by the variants explained hereinabove.

The variants of the first embodiment with exploded representation, using the tables of $m_{j!}$ (and/or $m_j$ or $m'_j$), comprise fewer addition/subtraction operations than the main embodiment that only uses the table of the values $m_{n!}$.

In this case, the saving in complexity is significant above all for the last positions (that is, when $m_{(n-k)!}$, $m'_j$, or $m_j$ are less than $m_{n!}$). Nevertheless, this saving in complexity is accompanied by an increase in the complexity of the memory reading steps (steps C-31, C-6 and C-7). While there are fewer values to be read, the address calculation is, on the other hand, more complicated.

An interesting trade-off then involves regularly storing the basic decompositions (with $m_{n!}$ exponents) to facilitate the addressing of the tables $D_j$ and $D_{j!}$, and then store the values $m_{j!}$ in a table $D_m$ with (n+1) cells. The values $m_j$ should then be stored to effectively reduce the number of additions/subtractions. However, this measure is necessarily accompanied by a reading of the values $m_{S_k}$ (respectively $m_{w[d_k]}$), before the steps C-6 and D-9 (respectively C-3 and D-19) whereas the value $m_{(n-k)!}$ must be read only at the start of each iteration on k.

Moreover, the benefits provided by the compact representation compared to the exploded representation are as follows:
 the step for updating the table P now comprises no more than a single addition (respectively subtraction) on the encoding (respectively on the decoding),
 the calculation of the exponent $$e_{I_k^{d_k}}$$

also requires only a single addition and a single subtraction,
 the address calculations for the reading of the words $e_K$ are direct and require, for each value K, only a single memory access and read.

However, the compact representation requires an extraction of the exponents of the partial rank $I_k^{d_k}$ contained in the word $$e_{I_k^{d_k}}$$

(steps CC-9 and DC-11).

However, this operation is not necessarily a drawback for the calculation of the partial rank from its prime factor decomposition, as will be seen hereinbelow.

There now follows a description of the advantages of such variants for the calculation of the partial rank from its prime factor decomposition.

The complexity of the step for calculating the product of the prime factor powers, in the sense of the steps C-9 and CC-10 (respectively D-11 and DC-12) in the encoding (respectively in the decoding) increases significantly with the number of factors, even though it remains far less complex than the division in the sense of the prior art. Now, in practice, many of the exponents of the decomposition of a partial rank are zero and therefore the corresponding powers are also at 1. Often, all the exponents are zero or only the first exponents are not zero. It is therefore useful to be able to detect and keep only the non-zero exponent powers. In the detailed representation, this detection can be performed only by $m_{n!}$ tests or $m_{(n-1-k)!}$ tests (one for each prime factor).

Advantageously, the compact representation makes it possible to test with a single test whether all the exponents are zero $$\left(\text{if } e_{t_k^d k} = 0\right)$$

and, in this case, the rank t'=1. Furthermore, the detection of the high order bit of $e_{t'}$ makes it possible to obtain the index of the greatest non-zero exponent prime factor in the rank t' and reduce the number of repetitions of the loop of the step CC-9 (respectively DC-11) in the encoding (respectively in the decoding).

It should nevertheless be noted that the detection of the non-zero exponents, in detailed representation as in compact representation, increases the complexity. If all the exponents are non-zero, the complexity of the multiplication of the powers of the prime factors remains the same and this complexity is then compounded by that of the procedure for detecting non-zero exponents.

Thus, in a first variant, the detection of the zero exponents can be conducted only if the possible number of prime factors becomes great (k much less than n) and the complexity of the multiplication of their powers is greater than the complexity of the detection procedure. For this, different loops according to the positions can be provided, even though this implementation is applied at the cost of an increase in the lines of instruction.

It is also possible to combine the exploded and compact representations. For the last positions (the value $m_{j!}$ being low), the calculation of the intermediate decompositions entails few operations. The use of an exploded representation is then favored, this representation not requiring the extraction of the exponents of a partial rank. On the other hand, for the first positions, the use of a compact representation is more favored.

There now follows a description of a few exemplary implementations in existing encoders/decoders.

3GPP AMR-WB+ Encoder

The 3GPP AMR-WB+ encoder (standard [3GPPTS26.304]) uses an algebraic vector quantization for which the dictionary is a union of the permutation codes of the Gosset network $RE_8$ of dimension 8.

The TCX technique corresponds to a predicting encoding by transform. More specifically, it involves an FFT transform encoding method applied after perceptual weighting filtering. In the standard [3GPPTS26.304], the FFT spectrum obtained is subdivided into subbands (or subvectors) of dimension n=8 and these subvectors are separately encoded. The quantization of the subvectors uses the regular network of points $RE_8$. The quantization dictionaries in dimension 8 consist of a union of permutation codes of type I obtained from the network of points $RE_8$.

In the TCX encoder according to the standard [3GPPTS26.304], each permutation code corresponds to a given signed leader vector in dimension n=8. The quantization index of a point of the network $RE_8$ is calculated by a formula of the type:

index=cardinality offset+permutation rank

The rank is calculated by the Schalkwijk formula whereas the cardinality offset is tabulated. Nevertheless, these signed leaders are represented via their absolute leaders in order to optimize the storage and the search in the permutation codes. The list of the associated absolute leaders can be found in the reference:

"*Low-complexity multi-rate lattice vector quantization with application to wideband TCX speech coding at 32 kbit/s*" by Ragot S., Bessette B., Lefebvre R., in Proc. ICASSP, vol. 1, May 2004 pp. 501-4.

To illustrate the different variants of the invention, three exemplary implementations are described below. The first two exemplary implementations relate to the calculation of the rank of a permutation (encoding), one using an exploded representation of the decompositions and the other a compact representation.

In these exemplary implementations hereinbelow and the corresponding appendices, the tables R and P are indexed from R[0] to R[$m_{n!}$−1] and from P[0] to P[$m_{n!}$−1] (and not from 1 to $m_{n!}$ as described by way of example hereinabove), but with no particular impact on the processing for the calculation of the rank.

First Exemplary Implementation (Encoding)

In this embodiment, an exploded representation of the basic decompositions is used.

Their exponents are stored in two tables with 36 cells (=(8+1)×4). These are the tables given in appendix A-11 and denoted $D_l$[36] (containing the exponents of the decompositions of the integers l (0≦l≦8) therefore with storage of a dummy decomposition for 0) and $D_{fl}$[36] (containing the exponents of the decompositions of their factorials).

The three tables of the powers of 3, 5 and 7 are also stored: Pow3[4]={1, 3, 9, 27}; Pow5[3]={1, 5, 25}; Pow7[3]={1, 7, 49}

In this embodiment, the decomposition of a partial rank is determined from two intermediate decompositions, one being the basic decomposition of the integer $S_k$ and the other being the intermediate decomposition of the quotient:

$$R_k = \frac{(7-k)!}{\prod_{i=0}^{q-1} (w_k^i !)}$$

As indicated above, rather than determine the intermediate decomposition of $R_k$ from basic decompositions corresponding to the (q+1) basic decompositions of (7−k)! and $(w_k^i!)_{i=0,\ldots,q-1}$, this intermediate decomposition is determined from the intermediate decomposition of $R_{k+1}$ and two basic decompositions of (7−k) and $w_k^{d(k)}$. The four exponents of this intermediate decomposition are stored in a table R.

TABLE 11

Maximum of $m_l$ or $m_{fl}$ for the decompositions of the terms of a partial rank in the position k and for the permutation codes of dimension 8

| k | (7 − k)! | $m_{(7-k)!}$ | $\max(w_k^i)$ | $\max(m_{w_k^i})$ | $\max(S_k)$ | $\max(m_{S_k})$ |
|---|----------|--------------|---------------|--------------------|-------------|------------------|
| 7 | 0 | 1 | 1 | 1 | 0 | 0 |
| 6 | 1 | 1 | 2 | 1 | 1 | 1 |
| 5 | 2 | 1 | 3 | 2 | 2 | 1 |
| 4 | 3 | 2 | 4 | 2 | 3 | 2 |
| 3 | 4 | 2 | 5 | 3 | 4 | 2 |
| 2 | 5 | 3 | 6 | 3 | 5 | 3 |
| 1 | 6 | 3 | 7 | 4 | 6 | 3 |
| 0 | 7 | 4 | 8 | 4 | 7 | 4 |

The invention applies the knowledge of $m_{(7-k)!}$ and of the maximums of $m_{w_k^i}$ and $m_{S_k}$ indicated for each position in the table 11 above so as not to calculate the exponents of the prime factors with indices greater than these limits.

The corresponding processing is given in appendix A-12. It will be noted that the loop on the positions is exploded. It will also be noted that the exponent of the prime factor $p_i$ of the quotient is stored in the cell R[i−1] of the table R with 4 cells.

Second Exemplary Implementation (Encoding)

In a variant with the 3GPP AMR-WB+ encoder, the basic decompositions are compactly represented. The words containing their exponents are stored in two tables with 9 cells (=(8+1)). Referring to appendix A-21, the table D'$_l$ contains the words for the decompositions of the integers l (0≦l≦8) (therefore with dummy storage of the decomposition for l=0) and the table D'$_{l!}$ contains the words for the decompositions of their factorials.

The powers of 3, 5 and 7 are also stored in a table Pow[12] with 12 cells (with dummy storage of 0 for the unused powers).

The decomposition of a partial rank is determined from three intermediate decompositions, two being the basic decompositions of the integer $S_k$ and of the factorial (7−k)! and the third being an intermediate decomposition of the denominator of the partial rank:

$$P_k = \prod_{i=0}^{q-1} (w_k^i !)$$

As indicated previously, rather than determining the intermediate decomposition of $P_k$ from the q basic decompositions of $(w_k^i!)_{i=0,\ldots,q-1}$, this decomposition is determined from the intermediate decomposition of $P_{k+}$, and from the basic decomposition of $w_k^{d(k)}$. The compact word containing the four exponents of this intermediate decomposition is denoted "eP" in appendix A-22. Also, "el" denotes the compact word containing the four exponents of the decomposition of a partial rank.

Here again, the knowledge of $m_{(7-k)!}$ is applied to extract only $m_{(7-k)!}$ exponents of the compact word representing the decomposition of a partial rank.

The corresponding processing is the subject of appendix A-22. Here again, the loop on the positions is exploded.

Third Exemplary Implementation (Decoding)

The third exemplary implementation deals with the decoding of the rank of a permutation, in 3GPP AMR-WB+ encoding.

An exploded representation of the basic decompositions is preferably used, as in the first exemplary embodiment, and a decomposition of the partial rank in three terms is preferably used as in the second exemplary embodiment. The loop on the positions is not however exploded.

As indicated previously, rather than determine the intermediate decomposition of $P_k$ from basic decompositions, it is determined from an intermediate decomposition of $P_{k-1}$ and from the basic decomposition of $w_k^{d_k}$. The four exponents of this intermediate decomposition are stored in a table P. Similarly, from the intermediate decomposition of $P_k$ and the basic decomposition of (7−k)!, another intermediate decomposition is calculated (that of the quotient), for which the exponents are stored in a table R.

The corresponding processing is the subject of appendix A-3. It will be noted that the exponent of the prime factor $p_i$ of the quotient (respectively of the product) is stored in the cell R[i−1] (respectively P[i−1]) of the table R (respectively P) with four cells.

Thus, the first example hereinabove uses a decomposition of the partial rank in two terms (including a quotient), the other two examples use a decomposition in three terms (two for the numerator and one for the denominator). The mode for the decoding uses only $m_{8!}(=4)$ terms whereas the two modes for the encoding use a separate processing of the positions to use the $m_{l!}$ or $m_l$ terms that are not read but "hardwired" in the algorithm by exploding the loop on the eight positions of a point of the Gosset network.

Exemplary Implementation for the TDAC Encoder

A final exemplary implementation concerns the Applicant's TDAC perceptual frequency encoder used to encode digital audio signals sampled at 16 kHz (wideband), the principle of which is described hereinbelow.

The TDAC encoder uses a statistical vector quantization with variable dimension and resolution and maximum dimension 15.

In the case of the permutation codes of the regular network of points $RE_8$ of dimension 8, the invention essentially makes it possible to reduce the complexity. However, in the case of the TDAC encoder, which uses permutation codes of dimensions greater than 12, the invention proves highly advantageous because it allows not only for a reduction in complexity but also for an implementation of the encoder on fixed point processors, the maximum precision of which is limited to unsigned 32-bit integers. Without the invention, such an implementation would be extremely complex.

The principle of this encoder is as follows.

An audio signal that is limited in bandwidth to 7 kHz and sampled at 16 kHz is subdivided into frames of 320 samples (20 ms). A modified discrete cosine transform ("MDCT") is applied to input signal blocks of 640 samples with an overlap of 50% (which corresponds to a refreshing of the MDCT analysis every 20 ms). The spectrum is limited to 7225 Hz by setting the last 31 coefficients to zero (then only the first 289 coefficients being different from 0). A masking curve is determined from this spectrum and all the masked coefficients are set to zero. The spectrum is divided into 32 bands of unequal widths. Any masked bands are determined according to the transform coefficients of the signals. For each band of the spectrum, the energy of the MDCT coefficients is calculated (to evaluate scale factors). The 32 scale factors constitute the spectral envelope of the signal which is then quantized, encoded and transmitted in the frame. The dynamic allocation of the bits is based on a masking curve for each band calculated from the dequantized version of the spectral envelope, so as to obtain a compatibility between the binary allocation of the encoder and of the decoder. The standardized MDCT coefficients in each band are then quantized by vector quantizers using dictionaries that are nested size wise, the dictionaries consisting of a union of type II permutation codes. Finally, the tone and voicing information and the spectral envelope and the coded coefficients are multiplexed and transmitted in frame.

The exemplary implementation for the calculation of the rank of a permutation (encoding) here uses a compact representation of the decompositions. The dimension of the permutation codes used being variable, the loop on the positions is not exploded. This embodiment illustrates a method of detecting non-zero exponents of the decomposition of a partial rank.

Here, the basic decompositions are compactly represented. The words containing their exponents are stored in two tables with 16 cells (=(15+1)). In appendix B-1, the table D'$_l$ contains the words for the decompositions of the integers l (0≦l≦15) and the table D'$_{l!}$ contains the words for the decompositions of their factorials.

The powers of 3 are also stored in a table with eight cells (denoted Pow3) and the powers of 5, 7, 11 and 13 in a table (denoted Pow) with twenty cells (with dummy storage of 0 for the unused powers).

The corresponding processing is retranscribed in appendix B-2.

Of course, the present invention is not limited to the embodiments described hereinabove by way of example; it embraces other variants.

To the knowledge of the Applicant, the present invention involves the first use of the prime factor power decompositions in the permutation codes. This use is however particularly advantageous when combinatorial expression calculations are provided, as in the vector quantization with permutation codes. Thus, generally, the present invention targets this use of the prime factor power decompositions for any combinatorial expression, even different from a rank of a permutation, in, encoding/decoding by one or more permutation codes.

The present invention is advantageously applicable in speech signal encoding/decoding, for example in telephony terminals, notably cellular. However, it applies to the encoding/decoding of signals of any other type, notably of image or video signals and encoded modulation.

The present invention also targets a computer program designed to be stored in memory of a digital signal encoding/decoding device, using permutation codes. This program then comprises instructions for implementing the steps of the method in the sense of the invention. Typically, FIGS. 4 to 8 described hereinabove can correspond to algorithm flow diagrams that such a program may comprise.

The present invention also targets a digital signal encoding/decoding device, using permutation codes, and comprising, with reference to FIG. 9:

- a memory unit MEM for storing the instructions of a computer program of the abovementioned type, and prerecorded representations of decompositions of selected integer numbers, and
- a calculation module PROC accessing this memory unit MEM to implement the method in the sense of the invention.

These means MEM, PROC can be designed:

to give the rank t of a permutation from the selected code vector y (solid line arrows in FIG. 9):

in an indexing module of a source encoder or
  in an indexing module of a channel decoder, or to give the code vector y to be reconstructed from the rank t of a permutation (broken line arrows in FIG. 9):

in a decoding module of a source decoder or
  in an encoding module of a channel encoder.

Of course, the prerecorded representations in the memory MEM can be in the form of address contents (exploded representation) or in the form of words of bits (compact representation).

APPENDICES

A-11

$D_I[36] = \{$
  0, 0, 0, 0,
  0, 0, 0, 0,
  1, 0, 0, 0,
  0, 1, 0, 0,
  2, 0, 0, 0,
  0, 0, 1, 0,
  1, 1, 0, 0,
  0, 0, 0, 1,
  3, 0, 0, 0};

$D_{II}[36] = \{$
  0, 0, 0, 0, /* 0! */
  0, 0, 0, 0, /* 1! */
  1, 0, 0, 0, /* 2! */
  1, 1, 0, 0, /* 3! */
  3, 1, 0, 0, /* 4! */
  3, 1, 1, 0, /* 5! */
  4, 2, 1, 0, /* 6! */
  4, 2, 1, 1, /* 7! */
  7, 2, 1, 1, /* 8! */
  };

A-12
Initialization:
  t=0
  w[i]=0, 0≦i<q
  R[0]=0
Processing of the Positions
  Position k=7:
    d7=d[7]; w[d7]=1
  Position k=6:
    d=d[6]; w[d]=w[d]+1
    If (d=d7) then R[0]=1
      else if (d>d7) t=1
  Position k=5:
    d=d[5]; w[d]=w[d]+1
    R[0]=R[0]+$D_I$[4*2]−$D_I$[4*w[d]]
    R[1]=−$D_I$[4*w[d]+1]
    S=0; loop from j=0 to d−1: S=S+w[j]
    Test if S>0; if yes:
      i2=R[0]+$D_I$[4*S]
      t=t+(1<<i2)
  Positions k=4 then 3:
    d=d[k]; w[d]=w[d]+1
    R[0]=R[0]+$D_I$[4*(7−k)]−$D_I$[4*w[d]]
    R[1]=R[1]+$D_I$[4*(7−k)+1]−$D_I$[4*w[d]+1]
    S=0; loop from j=0 to d−1: S=S+w[j]
    Test if S>0; if yes:
      i2=R[0]+$D_I$[4*S]
      i3=R[1]+$D_I$[4*S+1]
      t=t+pow3[i3]*(1<<i2)
  R[2]=−$D_I$[4*w[d]+2]
  Positions k=2 then 1:
    d=d[k]; w[d]=w[d]+1
    R[0]=R[0]+$D_I$[4*(7−k)]−$D_I$[4*w[d]]
    R[1]=R[1]+$D_I$[4*(7−k)+1]−$D_I$[4*w[d]+1]
    R[2]=R[2]+$D_I$[4*(7−k)+2]−$D_I$[4*w[d]+2]
    S=0; loop from j=0 to d−1: S=S+w[j]
    Test if S>0; if yes:

```
i2=R[0]+D_t[4*S]
i3=R[1]+D_t[4*S+1]
i5=R[2]+D_t[4*S+2]
t=t+pow5[i5]*pow3[i3]*(1<<i2)
R[3]=-D_t[4*w[d]+3]
Position k=0:
    d=d[0]; w[d]=w[d]+1
    R[0]=R[0]+D_t[4*7]-D_t[4*w[d]]
    R[1]=R[1]+D_t[4*7+1]-D_t[4*w[d]+1]
    R[2]=R[2]+D_t[4*7+2]-D_t[4*w[d]+2]
    R[3]=R[2]+D_t[4*7+3]-D_t[4*w[d]+3]
    S=0; loop from j=0 to d-1: S=S+w[j]
    Test if S>0; if yes:
        i2=R[0]+D_t[4*S]
        i3=R[1]+D_t[4*S+1]
        i5=R[2]+D_t[4*S+2]
        i7=R[3]+D_t[4*S+3]
        t=t+pow7[i7]*pow5[i5]*pow3[i3]*(1<<i2)
A-21

D'_t = { 0, 0, 1, 8, 2, 32, 9, 128, 3}
D'_tt = { 0, 0, 1, 9, 11, 43, 52, 180, 183}
Pow[12] = {
    1, 3, 9, 27,
    1, 5, 25, 0,
    1, 7, 49, 0};

A-22
Initialization:
    t=0
    w[i]=0, 0≦i<q
    eP=0
Position Processing
    Position k=7:
        d7=d[7]; w[d7]=1
    Position k=6:
        d=d[6]; w[d]=w[d]+1
        If (d=d7) then eP=1
            else if (d>d7) t=1
    Position k=5:
        d=d[5]; w[d]=w[d]+1
        eP=eP+D'_t[w[d]]
        S=0; loop from j=0 to d-1: S=S+w[j]
        Test if S>0; if yes:
            i2=D'_tt[2]+D'_t[S]
            i2=i2-eP
            t=t+(1<<i2)
    Positions k=4 then 3:
        d=d[k]; w[d]=w[d]+1
        eP=eP+D'_t[w[d]]
        S=0; loop from j=0 to d-1: S=S+w[j]
        Test if S>0; if yes:
            el=D'_tt[(7-k)]+D'_t[S]
            el=el-eP
            i2=el & (0x7)
            i3=el >>3
            t=t+pow[i3]*(1<<i2)
    Positions k=2 then 1:
        d=d[k w[d]=w[d]+1
        eP=eP+D'_t[w[d]]
        S=0; loop from j=0 to d-1: S=S+w[j]
        Test if S>0; if yes:
            el=D'_tt[(7-k)]+D'_t[S]
            el=el-eP
            i2=el & (0x7)
            el=el >>3
            i3=el &(0x3)
            el=el >>2
            i5=el &(0x3)
            t=t+pow[4+i5]*pow[i3]*(1<<i2)
    Position k=0:
        d=d[0]; w[d]=w[d]+1
        eP=eP+D'_t[w[d]]
        S=0; loop from j=0 to d-1: S=S+w[j]
        Test if S>0; if yes:
            el=D'_tt[(7)]+D'_t[S]
            el=el-eP
            i2=el & (0x7)
            el=el >>3
            i3=el &(0x3)
            el=el >>2
            i5=el &(0x3)
            el=el >>2
            i7=el &(0x3)
            t=t+pow[8+i7]*pow[4+i5]*pow[i3]*(1<<i2)
A-3
Initialization:
    Loop from i=0 to 3, P[i]=D_tt[4*w[0]+i]
    Loop from d=1 to q-1:
        Loop from i=0 to 3, P[i]=P[i]+D_tt[4*w[d]+i]
Position Processing
    Loop from k=0 to 7:
        Loop from i=0 to 3: R[i]=D_tt[4*(7-k)+i]-P[i]
        l=0
        d=0
        Repeat while w[d]=0, d=d+1
        R[0]=R[0]+D_t[4*(7-k)]-D_t[4*w[d]]
        R[1]=R[1]+D_t[4*(7-k)+1]-D_t[4*w[d]+1]
        R[2]=R[2]+D_t[4*(7-k)+2]-D_t[4*w[d]+2]
        S=0
        Repeat while (t-l>0)
            l'=l
            S=S+w[d]
            i2=R[0]+D_t[4*S]
            i3=R[1]+D_t[4*S+1]
            i5=R[2]+D_t[4*S+2]
            i7=R[3]+D_t[4*S+3]
            l=pow7[i7]*pow5[i5]*pow3[i3]*(1<<i2)
            d=d+1
        d=d-1
        l=l'
        t=t-l
        Loop from i=0 to 3, P[i]=P[i]-D_t[4*w[d]+i]
        w[d]=w[d]-1
        x[k]=a[d]
B-1
    D'_t={0, 0, 1, 16, 2, 128, 17, 512, 3, 32, 129, 2048, 18, 8192, 513, 144};
    D'_tt={0, 0, 1, 17, 19, 147, 164, 676, 679, 711, 840, 2888, 2906, 11098, 11611, 11755};
    Pow3[8]={1, 3, 9, 27, 81, 243, 729, 2187}
    Pow[4*5]={1, 5, 25, 125, 625, 1, 7, 49, 343, 0, 1, 11, 121, 0, 0, 1, 13, 169, 0, 0}
B-2
Initialization:
    t=0
    w[i]=0, 0≦i<q
    eP=0
```

Position Processing
    Position k=n-1:
        dn1=d[n-1]; w[dn1]=1
    Position k=n-2
        d=d[n-2]; w[d]=w[d]+1
        If (d=dn1) then eP=1
        If (d>dn1) t=1
    Positions from k=n-3 to 0:
        d=d[k]
        w[d]=w[d]+1
        eP=eP+D'$_l$[w[d]]
        S=0; loop from j=0 to d-1: S=S+w[j]
        Test if S>0; if yes:
            t'=1
            el=D'$_n$[(7-k)]+D'$_l$[S]
            el=el-eP
            Test if (el>0); if yes
                i2=el & (0xF)
                Pow[0]=1;
                ml=0
                i3=(el>>4) & 0x7
                if (i3>0)
                    pow[0]=Pow3[i3]
                    ml=ml+1
                el=el >>7
                if el>0
                    ml'=(16-norm_s(el))>>1
                    loop from j=0 to ml'
                    i=el &0x3
                    if i>0
                    if i>0
                    pow[ml]=Pow[i+5*j]
                    ml=ml+1
                    el=el >>2
                loop from i=0 to (ml-1): t'=t'xpow[i]
                t'=t'<<12
        t=t+t'

The invention claimed is:

1. A method of encoding/decoding digital signals, using permutation codes involving a calculation of combinatorial expressions,
    wherein said combinatorial expressions are represented by prime factor power decompositions, and determined by a memory reading of pre-recorded representations of decompositions of selected integer numbers.

2. The method as claimed in claim 1, wherein the permutation codes involve the calculation of a quantity representative of a rank of a permutation comprising a cumulation of partial ranks, each partial rank corresponding to one of said combinatorial expressions.

3. The method as claimed in claim 2, wherein the calculation of the rank of a permutation is used, when encoding vector-quantized digital signals, to index the permutations of the components of a leader vector, these permutations having been performed in a prior step to determine a code vector that is the closest to an input vector.

4. The method as claimed in claim 3, wherein the encoding/decoding is of the type of a source encoding/decoding with vector quantization.

5. The method as claimed in claim 2, wherein, when decoding vector-quantized digital signals, from a given value of a permutation rank:
    at least one quantity representative of a permutation rank approaching said given value is calculated according to at least one presumed component of a code vector to be constructed,
    the selection of the presumed component is validated if said representative quantity satisfies a condition of proximity with the given value of the rank.

6. The method as claimed in claim 5, wherein said proximity condition is satisfied if the given value of the rank can be bracketed by cumulations of partial ranks up to the partial rank associated with the presumed component, on the one hand, and up to the partial rank associated with a component corresponding to an incrementation of the presumed component, on the other hand.

7. The method as claimed in claim 2, wherein the encoding/decoding is of the type of a channel modulation encoding/decoding, and it comprises:
    before transmission, the determination of a code vector from the rank of a permutation, and
    in reception, the calculation of the rank of a permutation from a code vector corresponding to a received vector.

8. The method as claimed in claim 2, wherein the permutation code uses a Schalkwijk enumeration, and in that a partial rank associated with a truncation $(y_k, \ldots y_{n-1})$ of a code vector $(y_0, \ldots y_{n\ 1})$ is expressed:

$$I_k^{d_k} = \frac{(n-1-k)!}{\prod_{i=0}^{q-1}(w_k^i!)}\left(\sum_{d=0}^{d_k-1} w_k^d\right),$$

in which
    the notation $$\prod_{i=0}^{m}$$

represents a product for an integer index i ranging from 0 to m,
    the notation $$\sum_{i=0}^{m}$$

represents a sum for an index i ranging from 0 to m, the notation l! is the factorial value of the integer number l with l!=1x 2x 3x ... x (l-1) x l, for l>0 and with 0!=1,
    the integer n is the dimension of the permutation code, corresponding to the total number of components that a code vector comprises:
    the integer k, between 0 and n-1, is the index of the kth component $y_k$ of the code vector,
    the integer q is the number of separate components that the code vector comprises, and
    a term $W_k^d$ represents the number of index components between k and n-1, and which have a value equal to that of one and the same index component d.

9. The method as claimed in claim 8, wherein the calculation of the rank takes place on encoding by determining the cumulation of the partial ranks $I_k^{d_k}$, each estimated according to a truncation $(y_k, \ldots y_{n-1})$ of the code vector $(y_0, \ldots y_{n-})$, for an index k ranging from n-1 to 0.

10. The method as claimed in claim 9, wherein a test is performed on the value of the term $$S_k = \sum_{d=0}^{d_k-1} w_k^d$$

to avoid estimating the partial rank $I_k^{d_k}$ if the term $S_k$ is zero.

11. The method as claimed in claim 8, wherein the calculation of a quantity representative of a decumulation of the partial ranks $I_k^{d_k}$ takes place on decoding to determine the components $y_k$ of the code vector, of index k ranging from 0 to n−1.

12. A computer program to be stored in memory of a device for encoding/decoding digital signals, using permutation codes, comprising instructions for implementing the steps of the method as claimed in claim 1.

13. A device for encoding/decoding digital signals, using permutation codes, characterized in that it comprises:
    a memory unit for storing pre-recorded representations of decompositions of selected integer numbers, and the instructions of a computer program, comprising: instructions for implementing the steps of a method of encoding/decoding digital signals, using permutation codes involving calculation of combinatorial expressions, wherein said combinatorial expressions are represented by prime factor power decompositions, and determined by reading of the pre-recorded representations of decompositions of selected integer numbers from the memory unit; and
    a calculation module accessing said memory unit to implement the method of encoding/decoding digital signals.

* * * * *